(12) United States Patent
Kim et al.

(10) Patent No.: US 9,847,278 B2
(45) Date of Patent: Dec. 19, 2017

(54) SEMICONDUCTOR DEVICES HAVING AIR SPACERS AND METHODS OF MANUFACTURING THE SAME

(71) Applicant: Samsung Electronics Co., Ltd., Suwon-si, Gyeonggi-do (KR)

(72) Inventors: Kyung-Eun Kim, Seoul (KR); Yongkwan Kim, Yongin-si (KR); Semyeong Jang, Gunpo-si (KR); Jaehyoung Choi, Hwaseong-si (KR); Yoosang Hwang, Suwon-si (KR); Bong-Soo Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/095,327

(22) Filed: Apr. 11, 2016

(65) Prior Publication Data

US 2017/0062347 A1    Mar. 2, 2017

(30) Foreign Application Priority Data

Aug. 31, 2015  (KR) .......................... 10-2015-0122922

(51) Int. Cl.

| | | |
|---|---|---|
| *H01L 21/70* | (2006.01) | |
| *H01L 21/76* | (2006.01) | |
| *H01L 23/482* | (2006.01) | |
| *H01L 29/06* | (2006.01) | |
| *H01L 21/762* | (2006.01) | |
| *H01L 21/768* | (2006.01) | |

(Continued)

(52) U.S. Cl.
CPC ...... *H01L 23/4821* (2013.01); *H01L 21/7682* (2013.01); *H01L 21/76264* (2013.01); *H01L 27/10855* (2013.01); *H01L 27/10885* (2013.01); *H01L 29/0649* (2013.01); *H01L 23/5222* (2013.01); *H01L 23/53295* (2013.01); *H01L 27/10814* (2013.01)

(58) Field of Classification Search
CPC ....................... H01L 23/4821; H01L 21/76264
USPC ................................. 257/374; 438/422, 619
See application file for complete search history.

(56) References Cited

U.S. PATENT DOCUMENTS

| | | |
|---|---|---|
| 6,362,073 B2 | 3/2002 | Kim |
| 6,492,245 B1 | 12/2002 | Liu et al. |

(Continued)

FOREIGN PATENT DOCUMENTS

| | | |
|---|---|---|
| KR | 20140055183 A | 5/2014 |
| KR | 20140146705 A | 12/2014 |

*Primary Examiner* — Calvin Lee
(74) *Attorney, Agent, or Firm* — Harness, Dickey & Pierce, P.L.C.

(57) ABSTRACT

A semiconductor device includes first and second bit line structures on a substrate and spaced apart from each other, a via plug partially filling between the first and second bit line structures, a via pad in contact with an upper surface of the via plug and an upper sidewall of the first bit line structure, the via pad being spaced apart from an upper portion of the second bit line structure, a first cavity filled with air being between the via plug and the first bit line structure and a second cavity filled with air between the via plug and the second bit line structure, A gap capping spacer having a first portion on the upper sidewall of the first bit line structure and a second portion covers the first air spacer. A horizontal width of the first portion is smaller than that of the second portion.

17 Claims, 26 Drawing Sheets

(51) Int. Cl.
  *H01L 27/108* (2006.01)
  *H01L 23/522* (2006.01)
  *H01L 23/532* (2006.01)

(56) References Cited

U.S. PATENT DOCUMENTS

| | | |
|---|---|---|
| 9,041,122 B2 | 5/2015 | Yoo et al. |
| 9,379,004 B1 * | 6/2016 | Kwon .................. H01L 27/1052 |
| 9,520,348 B2 * | 12/2016 | Choi ..................... H01L 23/498 |
| 2013/0292847 A1 | 11/2013 | Choi et al. |
| 2013/0328199 A1 | 12/2013 | Yun et al. |
| 2014/0179101 A1 | 6/2014 | Lee et al. |
| 2014/0327063 A1 | 11/2014 | Park |
| 2014/0367825 A1 | 12/2014 | Kim et al. |
| 2015/0035050 A1 | 2/2015 | Yeom et al. |
| 2015/0061134 A1 | 3/2015 | Lee et al. |
| 2015/0061154 A1 | 3/2015 | Choi et al. |
| 2015/0126013 A1 | 5/2015 | Hwang et al. |

* cited by examiner

SEMICONDUCTOR DEVICES HAVING AIR SPACERS AND METHODS OF MANUFACTURING THE SAME

CROSS-REFERENCE TO RELATED APPLICATION

This application claims priority under 35 U.S.C. §119 to Korean Patent Application No. 10-2015-0122922 filed on Aug. 31, 2015 in the Korean Intellectual Property Office, the disclosure of which is hereby incorporated by reference in its entirety.

BACKGROUND

Technical Field

Example embodiments of the inventive concepts relate to semiconductor devices having an air spacer and methods of manufacturing the same.

Description of Related Art

As semiconductor devices become more highly integrated, intervals between conductive patterns become smaller, and thus crosstalk between the conductive patterns can occur. Further, parasitic capacitance between the adjacent conductive patterns electrically isolated by an insulating layer can increase. Accordingly, a technique of forming a spacer having a lower dielectric constant between the conductive patterns is required in order to reduce the parasitic capacitance between the conductive patterns.

SUMMARY

Example embodiments of the inventive concepts provide semiconductor devices in which parasitic capacitance between bit line structures is reduced.

Example embodiments of the inventive concepts provide semiconductor devices having an air spacer between the bit line structures.

Example embodiments of the inventive concepts provide methods of manufacturing the semiconductor devices.

In accordance with various example embodiments of the inventive concepts, a semiconductor device includes a first bit line structure and a second bit line structure on a substrate, and the first and second bit line structures being spaced apart from each other, a via plug partially filling an area between the first bit line structure and the second bit line structure, a via pad in contact with an upper surface of the via plug and an upper sidewall of the first bit line structure, the via pad being spaced apart from an upper portion of the second bit line structure, the via plug and the first bit line structure being separated from each other by a first cavity filled with air, and the via plug and the second bit line structure being separated from each other by a second cavity filled with air, and a gap capping spacer having a first portion on the upper sidewall of the first bit line structure and a second portion covering the first cavity. A horizontal width of the first portion of the gap capping spacer is smaller than a horizontal width of the second portion of the gap capping spacer.

An area connecting the first portion and the second portion of the gap capping spacer may have a round shape or a step shape.

The semiconductor device may include a pad isolation region on the second cavity. A bottom surface of the pad isolation region defines an upper end portion of the second cavity, and a bottom surface of the gap capping spacer defines an upper end portion of the first cavity. The bottom surface of the gap capping spacer may be at a higher level than the bottom surface of the pad isolation region.

The semiconductor may further include a first inner spacer between the first bit line structure and the first cavity, a second inner spacer between the second bit line structure and the second cavity, a first outer spacer between the via plug and the first cavity, and a second outer spacer between the via plug and the second cavity.

The first and second inner spacers and the first and second outer spacers may include a same material, and the gap capping spacer may include a different material from the first and second inner spacers and the first and second outer spacers.

The first and second inner spacers and the first and second outer spacers may include silicon nitride, and the gap capping spacer may include at least one of silicon boronitride (SiBN), aluminum oxide (AlO) and titanium oxide (TiO).

The gap capping spacer, the first and second inner spacers and the first and second outer spacers may include a same material.

An upper surface of the first inner spacer may be at a higher level than an upper surface of the second inner spacer.

An upper surface of the first outer spacer may be at a lower level than the upper surface of the first inner spacer, and an upper surface of the second outer spacer may be at a lower level than the upper surface of the second inner spacer.

The upper surface of the via plug may be at a lower level than an upper end of the first cavity and an upper end of the second cavity.

The semiconductor may further include a pad isolation region between an upper portion of the second bit line structure and the via pad. The pad isolation region may vertically overlap with the second cavity.

In accordance with various example embodiments of the inventive concepts, a semiconductor device includes a first bit line structure and a second bit line structure on a substrate, the first and second bit line structures being spaced apart from each other, a via structure between the bit line structures, a first side of the via structure and a lower sidewall of the first bit line structure being separated from each other by a first cavity filled with air, and a second side of the via structure and a lower sidewall of the second bit line structure being separated from each other by a second cavity filled with air, a pad isolation region partially extending between the second side of the via structure and an upper sidewall of the second bit line structure, and a gap capping spacer between the first side of the via structure and the upper sidewall of the first bit line structure. The gap capping spacer includes a first portion extending along the upper sidewall of the first bit line structure in a first direction and a second portion extending on the first cavity in a second direction perpendicular to the first direction, and a horizontal width of the first portion of the gap capping spacer is smaller than a horizontal width of the second portion of the gap capping spacer.

The pad isolation region may include a pad isolation trench partially extending between the upper sidewall of the second bit line structure and the second side of the via structure, and a pad isolation insulator filling the pad isolation trench.

A lower surface of the pad isolation region may include a first lower surface in contact with the via structure and a second lower surface in contact with the second bit line structure. The first lower surface may be at a higher level than the second lower surface.

The pad isolation region may include an upper pad isolation region at a higher level than upper surfaces of the first and second bit line structures, and a lower pad isolation region between the via structure and the second bit line structure. A horizontal width of the upper pad isolation region may be smaller than a horizontal width of the lower pad isolation region.

In accordance with example embodiments, a semiconductor device includes bit line structures spaced apart from each other, via structures between the bit line structures, and first and second spacer structures separating the bit lines structures from the via structures, the first and second spacer structures defining respective gaps. The first spacer structures each include a gap capping spacer. The gap capping spacer extends from a first inner spacer to a first outer spacer of a respective one of the first spacer structures to form an upper surface of the respective one of the first spacer structures. The gap capping spacer has a varied width.

The spacer may include a first capping layer extending along a sidewall of the first inner spacer, and a second capping layer extending from the sidewall of the first inner spacer to an upper surface of the first outer spacer. The first capping layer may be substantially perpendicular to the second capping layer.

The second spacer structures may each include a second inner spacer and a second outer spacer spaced apart from each other. A height of the second inner spacer may be greater than a height of the second outer spacer.

The semiconductor device may further include pad isolation regions on the second spacer structures, the pad isolation regions extending within an upper portion of the bit line structures.

The pad isolation regions may each have a first bottom surface on the bit line structures, and a second bottom surface on the via structures, the first and second bottom surfaces being at different heights.

Details of other example embodiments are included in the detailed description and drawings.

BRIEF DESCRIPTION OF THE DRAWINGS

Example embodiments will be more clearly understood from the following detailed description taken in conjunction with the accompanying drawings. FIGS. 1-5F represent non-limiting, example embodiments as described herein.

FIG. 1 is a layout showing semiconductor devices according to various example embodiments of the inventive concepts;

FIGS. 3A to 5F are views illustrating methods of manufacturing semiconductor devices according to various example embodiments of the inventive concepts.

DETAILED DESCRIPTION OF EXAMPLE EMBODIMENTS

Figure 1:
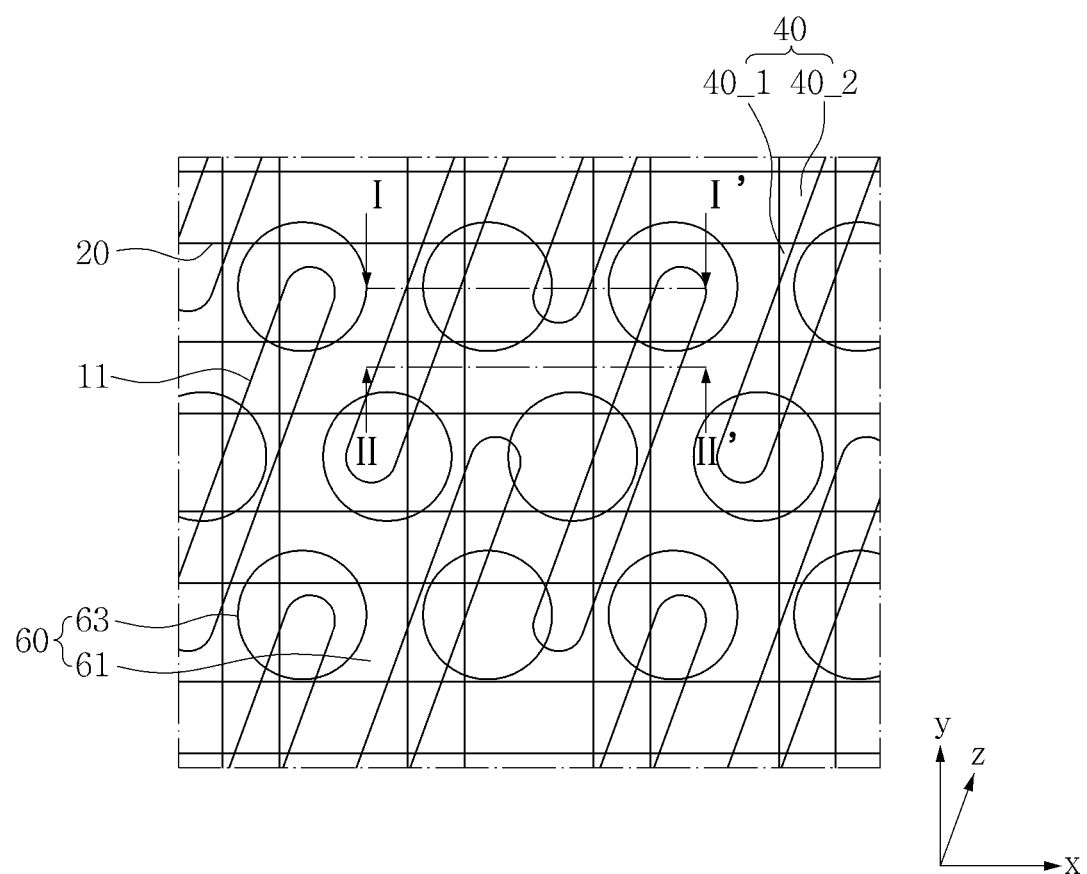

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various features will be described in detail with reference to the attached drawings. However, example embodiments described are not limited thereto.

FIG. 1 is a layout showing semiconductor devices according to various example embodiments of the inventive concepts.

Referring to FIG. 1, semiconductor devices according to various embodiments of the inventive concepts may include gate structures 20 extending in an X direction, bit line structures 40 extending in a Y direction perpendicular to the X direction, and active regions 11 in bar shapes extending in a Z direction diagonal to each of the X direction and the Y direction. The bit line structures 40 may vertically overlap portions of the active regions 11. The semiconductor devices may include via structures 60 vertically overlapping other portions of the active regions 11.

Figure 2A:
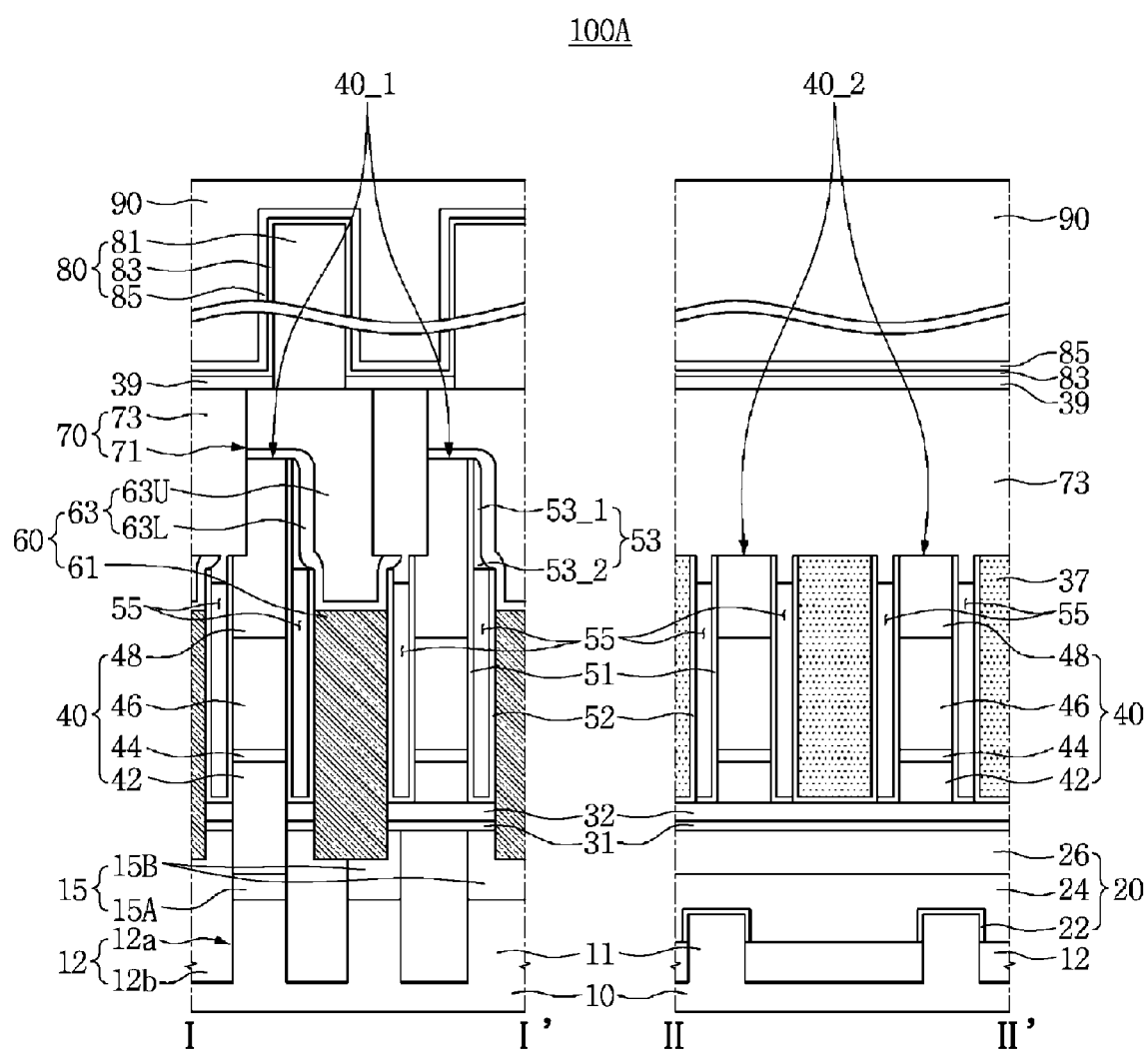
FIGS. 2A to 2C are longitudinal cross-sectional views taken along lines I-I' and II-II' of FIG. 1 for describing semiconductor devices according to various example embodiments of the inventive concepts.

FIG. 2A are longitudinal cross-sectional views taken along lines I-I' and II-II' of FIG. 1 for describing a semiconductor device in accordance with various example embodiments of the inventive concepts.

Referring to FIG. 2A, a semiconductor device 100A in accordance with various example embodiments of the inventive concepts may include a substrate 10, device isolation regions 12 formed in the substrate 10 and defining active regions 11, source/drain areas 15, gate structures 20, bit line structures 40, via structures 60, and capacitor structures 80. The semiconductor device 100A may further include inner spacers 51, outer spacers 52, air spacers 55, and gap capping spacers 53 on sidewalls of the bit line structures 40. The via structures 60 may include via plugs 61 and via pads 63 on the via plugs 61. The semiconductor device 100A may further include pad isolation regions 70 that electrically separates the via pads 63.

The substrate 10 may include a single crystalline semiconductor substrate such as a silicon wafer or a silicon-on-insulator (SOI) wafer.

The device isolation region 12 may include device isolation trenches 12a formed in the substrate 10, and device isolation insulators 12b filling in the device isolation trenches 12a. The device isolation insulators 12b may include silicon oxide.

The active regions 11 may include portions vertically overlapping the bit line structures 40 and portions vertically overlapping the via structures 60. The active regions 11 may protrude from the substrate 10.

The source/drain areas 15 may include first source/drain areas 15A and second source/drain areas 15B. For example, the first source/drain areas 15A may be formed in a part of the active regions 11. The second source/drain areas 15B may be formed in another part of the active regions 11. The first source/drain areas 15A may be in contact with the bit line structures 40, and the second source/drain areas 15B may be in contact with the via structures 60.

The gate structures 20 may include gate insulating patterns 22, gate electrode patterns 24, and gate capping patterns 26. The gate structures 20 may be buried in the substrate 10.

The gate insulating patterns 22 may be conformally formed on upper and side surfaces of the active regions 11. The gate insulating patterns 22 may include at least one of silicon oxide, silicon nitride, silicon oxynitride, and a metal oxide. The metal oxide may include at least one of hafnium oxide ($Hf_xO_y$), aluminum oxide ($Al_xO_y$), zirconium oxide ($Zr_xO_y$), lanthanum oxide ($La_xO_y$), and titanium oxide ($Ti_xO_y$).

The gate electrode patterns 24 may be formed to intersect the active regions 11 and to extend onto the device isolation region 12. The gate electrode patterns 24 may include at least one of a metal nitride, such as titanium nitride (TiN) or tantalum nitride (TaN), and a metal such as tungsten (W) or copper (Cu). The gate electrode patterns 24 may be word lines of a memory device such as a dynamic random access memory (DRAM) and so on.

The gate capping patterns 26 may be formed on the gate electrode patterns 24. The gate capping patterns 26 may include silicon nitride.

The bit line structures 40 may include bit line contact patterns 42, bit line barrier patterns 44, bit line electrode patterns 46, and bit line capping patterns 48.

The bit line contact patterns 42 may be in contact with a part of the active regions 11. For example, the part of the bit line contact patterns 42 may be in contact with the first source/drain areas 15A. Lower surfaces of the bit line contact patterns 42 in contact with the first source/drain areas 15A may be located at lower levels than lower surfaces of the bit line contact patterns 42 not in contact with the first source/drain areas 15A. The bit line contact patterns 42 may include polysilicon.

The bit line barrier patterns 44 may be formed on the bit line contact patterns 42. The bit line barrier patterns 44 may include a metal or a metal compound such as titanium (Ti), titanium nitride (TiN), titanium silicide (TiSi), tantalum (Ta), tantalum nitride (TaN), tantalum silicide (TaSi), nickel silicide (NiSi), cobalt silicide (CoSi), tungsten nitride (WN), or tungsten silicide (WSi).

The bit line electrode patterns 46 may be formed on the bit line barrier patterns 44. The bit line electrode patterns 46 may include a metal such as tungsten (W) or copper (Cu).

The bit line capping patterns 48 may be formed on the bit line electrode patterns 46. The bit line capping patterns 48 may include portions partially recessed by the pad isolation regions 70 and portions partially covered by the via pads 63. The bit line capping patterns 48 may include silicon nitride.

Sidewalls of the bit line contact patterns 42, sidewalls of the bit line barrier patterns 44, sidewalls of the bit line electrode patterns 46, and sidewalls of the bit line capping patterns 48 may be vertically aligned.

The bit line structures 40 may include first portions 40_1 not vertically overlapping the gate structures 20, and second portions 40_2 vertically overlapping the gate structures 20. For example, referring to FIG. 1, the first portions 40_1 of the bit line structures 40 may be portions located between the gate structures 20, and the second portions 40_2 of the bit line structures 40 may be portions intersecting the gate structures 20. Upper surfaces of the first portions 40_1 of the bit line structures 40 may be located at higher levels than upper surfaces of the second portions 40_2 of the bit line structures 40.

The via structures 60 may electrically connect the second source/drain areas 15B to the capacitor structures 80. The via structures 60 may include via plugs 61 and via pads 63.

The via plugs 61 may be in direct contact with the second source/drain areas 15B. The via plugs 61 may include polysilicon. The via plugs 61 may be located between the gate structures 20 between the first portions 40_1 of the bit line structures 40. The via plugs 61 may include first sidewalls and second sidewalls. For example, the first sidewalls of the via plugs 61 may not vertically overlap the pad isolation regions 70, and the second sidewalls of the via plugs 61 may vertically overlap the pad isolation regions 70.

The via pads 63 may be formed on the via plugs 61. The via pads 63 may include via barrier pattern 63L and via electrode patterns 63U.

The via barrier patterns 63L may be conformally formed on upper surfaces of the via plugs 61, outer side surfaces of the outer spacers 52, outer side surfaces of the gap capping spacers 53, upper surfaces of the inner spacers 51, and upper surfaces of the bit line structures 40. A part of the via barrier patterns 63L may extend between lower surfaces of the pad isolation regions 70 and upper surfaces of the outer spacers 52. The via barrier patterns 63L may include at least one of titanium nitride (TiN), tantalum nitride (TaN), and another metal nitride.

The via electrode patterns 63U may be formed on the via barrier patterns 63L. The via electrode patterns 63U may include a metal such as tungsten (W) or copper (Cu). Each of the via electrode patterns 63U may include a lower via electrode pattern located between the bit line structures 40 and an upper via electrode pattern located at a higher level than the upper surfaces of the bit line structures 40. A horizontal width of the upper via electrode pattern may be greater than a horizontal width of lower via electrode patterns. The upper portions of the via electrode patterns 63U may partially cover the upper surfaces of the bit line structures 40.

In various example embodiments, the via structures 60 may further include silicide patterns between the via plugs 61 and the via pads 63. The silicide patterns may include titanium silicide (TiSi), tungsten silicide (WSi), nickel silicide (NiSi), cobalt silicide (CoSi), or another metal silicide.

The pad isolation regions 70 may be formed to partially pass through boundaries between sidewalls of the bit line structures 40 and the via pads 63. Upper surfaces of the pad isolation regions 70 and upper surfaces of the via pads 63 may be substantially coplanar. The pad isolation regions 70 may include pad isolation trenches 71 partially passing through boundaries between sidewalls of the bit line structures 40 and the via pads 63 and pad isolation insulator 73 filling the pad isolation trenches 71.

The pad isolation trenches 71 may extend from the upper surfaces of the via electrode patterns 63U toward the substrate 10. Lower surfaces of the pad isolation trenches 71 may be located at higher levels than upper surfaces of the outer spacers 52. Accordingly, a part of the via barrier patterns 63L may extend between the lower surfaces of the pad isolation trenches 71 and the upper surfaces of the outer spacers 52. Upper portions of the bit line capping patterns 48 of the bit line structures 40 and upper portions of the inner spacers 51 on the sidewalls of the bit line structures 40 may be partially recessed by the pad isolation trenches 71 so as to form a single step in the bit line capping patterns 48. According to various example embodiments, upper portions of the bit line capping patterns 48 of the bit line structures 40 and upper portions of the inner spacers 51 on the sidewalls of the bit line structures 40 may be partially recessed by the pad isolation trenches 71 so as to form a plurality of steps in the bit line capping patterns 48. The pad isolation insulator 73 may extend between the inner spacers 51 vertically overlapping the pad isolation trenches 71 and the outer spacers 52 vertically overlapping the pad isolation trenches 71. The pad isolation insulator 73 may include silicon nitride (SiN).

The inner spacers 51 may be conformally formed on the sidewalls of the bit line structures 40. The inner spacers 51 may include inner spacers 51 vertically overlapping the pad isolation regions 70, and inner spacers 51 vertically overlapping the via pads 63. Upper surfaces of the inner spacers 51 vertically overlapping the pad isolation regions 70 may be located at lower levels than upper surfaces of the inner spacers 51 vertically overlapping the via pads 63. The upper surfaces of the inner spacers 51 vertically overlapping the via pads 63 may be substantially coplanar with the upper surfaces of the bit line structures 40. The inner spacers 51 may include silicon nitride (SiN).

The outer spacers 52 may be formed on the sidewalls of the bit line structures 40 to be spaced apart from the inner spacers 51. Upper surfaces of the outer spacers 52 may be located at lower levels than the upper surfaces of the bit line structures 40 and the upper surfaces of the inner spacers 51. Further, upper surfaces of the outer spacers 52 on sidewalls of the second portions 40_2 of the bit line structures 40 may be located at higher levels than upper surfaces of the outer spacers 52 on sidewalls of the first portions 40_1 of the bit line structures 40. The outer spacers 52 may include silicon nitride (SiN).

The air spacers 55 may be formed between the inner spacers 51 and the outer spacers 52 on the sidewalls of the bit line structures 40. Upper end portions of the air spacers 55 may be located at lower levels than the upper surfaces of the bit line structures 40. Further, upper end portions of the air spacers 55 vertically overlapping the pad isolation regions 70 may be located at lower levels than upper end portions of the air spacers 55 vertically overlapping the via pads 63. Further, upper surfaces of the outer spacers 52 vertically overlapping the via pads 63 and the upper end portions of the air spacers 55 may be substantially coplanar. Further, upper surfaces of the outer spacers 52 vertically overlapping the pad isolation regions 70 may be located at higher levels than the upper surfaces of the air spacers 55.

Although the semiconductor device 100A according to example embodiments is shown including the air spacers 55, one of ordinary skill in the art should appreciate that the spacers 55 may be composed of a medium (gas or solid), other than air, having a low dielectric constant. The spacer 55 may be an area under a low vacuum, or below atmospheric pressure.

The gap capping spacers 53 may be formed between outer side surfaces of inner spacers 51 vertically overlapping the via pads 63, the upper end portions of the air spacers 55, the upper surfaces of the outer spacers 52, and the via barrier patterns 63L of the via pads 63. The gap capping spacers 53 may include first portions 53_1 disposed on the sidewalls of the bit line structures 40, and second portions 53_2 disposed on the upper end portions of the air spacers 55 and the upper surfaces of the outer spacers 52. Horizontal widths of the first portions 53_1 of the gap capping spacers 53 may be smaller than horizontal widths of the second portions 53_2 of the gap capping spacers 53. Vertical lengths of the first portions 53_1 of the gap capping spacers 53 may be greater than vertical lengths of the second portions 53_2 of the gap capping spacers 53. The second portions 53_2 of the gap capping spacers 53 may fully cover the upper end portions of the air spacers 55 and the upper surfaces of the outer spacers 52.

Areas connecting the first portions 53_1 of the gap capping spacers 53 and the second portions 53_2 of the gap capping spacers 53 may have round shapes. The gap capping spacers 53 may include a different material from the inner spacers 51 and the outer spacers 52. For example, the gap capping spacers 53 may include silicon boronitride (SiBN).

The capacitor structures 80 may include capacitor lower electrodes 81, a capacitor dielectric layer 83, and a capacitor upper electrode 85.

The capacitor lower electrodes 81 may be electrically connected to the via structures 60. The capacitor lower electrodes 81 may be in contact with the via pads 63 of the via structures 60. The capacitor lower electrodes 81 may include a conductive material such as doped polysilicon, a metal, or a metal compound.

The capacitor dielectric layer 83 may conformally cover surfaces of the capacitor lower electrodes 81. For example, the capacitor dielectric layer 83 may be conformally formed on upper and side surfaces of the capacitor lower electrode 81. The capacitor dielectric layer 83 may include at least one of a metal oxide, such as hafnium oxide ($Hf_xO_y$), aluminum oxide ($Al_xO_y$), titanium oxide ($Ti_xO_y$), tantalum oxide ($Ta_xO_y$), ruthenium oxide ($Ru_xO_y$), or lanthanum oxide ($La_xO_y$), silicon oxide, and silicon nitride.

The capacitor upper electrode 85 may be conformally formed on the capacitor dielectric layer 83. The capacitor upper electrode 85 may include a metal or a metal compound.

The semiconductor device 100A may further include a first lower interlayer insulating layer 31 on the source/drain areas 15 and the gate structures 20 and a second lower interlayer insulating layer 32 on the first lower interlayer insulating layer 31. For example, the first lower interlayer insulating layer 31 may include silicon oxide, and the second lower interlayer insulating layer 32 may include silicon nitride. The first lower interlayer insulating layer 31 and the second lower interlayer insulating layer 32 may partially extend through by the bit line structures 40 and the via plugs 61.

The semiconductor device 100A may further include an intermediate interlayer insulating layer 37 filling between the second portions 40_2 of the bit line structures 40. For example, the intermediate interlayer insulating layer 37 may fill a space defined by the outer spacers 52 on the sidewalls of the second portions 40_2 of the bit line structures 40. The intermediate interlayer insulating layer 37 may include silicon nitride (SiN). The upper surfaces of the second portions 40_2 of the bit line structures 40, the upper surfaces of the inner spacers 51 and the outer spacers 52, and an upper surface of the intermediate interlayer insulating layer 37 may be substantially coplanar. Further, the upper surface of the intermediate interlayer insulating layer 37 may be located at a higher level than the upper end portions of the air spacers 55 on the sidewall of the second portions 40_2 of the bit line structures 40.

The semiconductor device 100A may further include an etch stop layer 39 disposed between the pad isolation regions 70 and the capacitor structures 80. The etch stop layer 39 may extend onto a part of the via electrode patterns 63U of the via pads 63. The etch stop layer 39 may include silicon nitride (SiN).

The semiconductor device 100A may further include a capacitor capping insulating layer 90 covering the capacitor structures 80. The capacitor capping insulating layer 90 may include silicon oxide or silicon nitride.

Figure 2B:
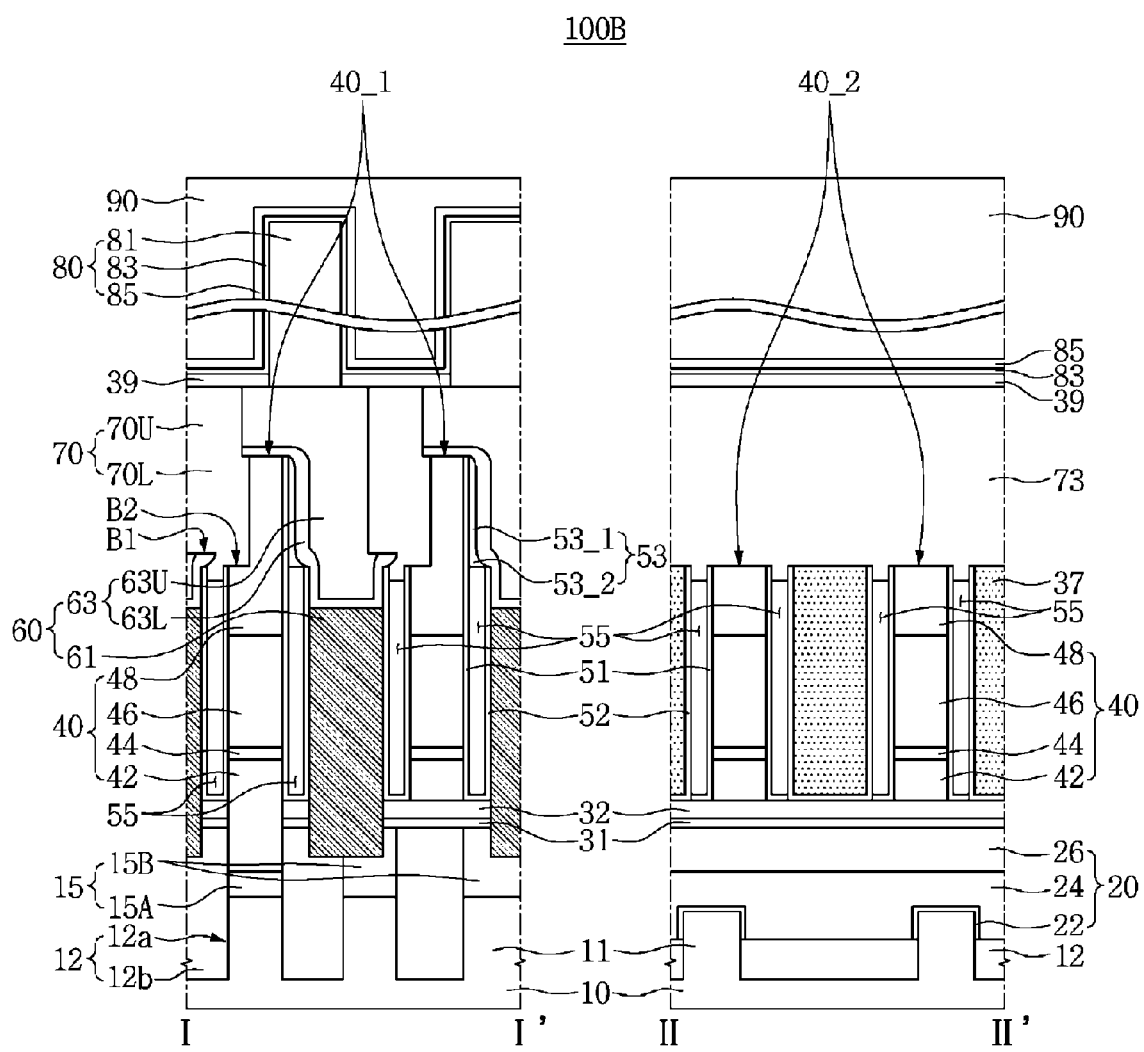

FIG. 2B illustrates longitudinal cross-sectional views taken along lines I-I' and II-II' of FIG. 1 for describing a semiconductor device in accordance with some example embodiments of the inventive concepts. In the example embodiments of the inventive concepts, detailed descriptions of the same content as those of the above-described example embodiments will be omitted.

Referring to FIG. 2B, a semiconductor device 100B according to various example embodiments of the inventive concepts may include pad isolation regions 70 having lower pad isolation regions 70L overlapping upper sidewalls of bit line structures 40 and upper pad isolation regions 70U located at a higher level than upper surfaces of the bit line structures 40.

Horizontal widths of the lower pad isolation regions 70L may be greater than horizontal widths of the upper pad isolation regions 70U. The lower pad isolation regions 70L may include first side surfaces in contact with the via pads 63 and second side surfaces in contact with bit line capping patterns 48 of the bit line structures 40. The upper pad isolation regions 70U may include first side surfaces vertically aligned with the first side surfaces of the lower pad isolation regions 70L and second side surfaces not vertically aligned with the second side surfaces of the lower pad isolation regions 70L.

The lower pad isolation regions 70L may include first bottom surfaces B1 in contact with the via pads 63 and second bottom surfaces B2 in contact with the bit line structures 40. The first bottom surfaces B1 of the lower pad isolation regions 70L may be located at higher levels than the second bottom surfaces B2 of the lower pad isolation regions 70L.

Further, in the semiconductor device 100B in accordance with the various example embodiments of the inventive concepts, gap capping spacers 53 may include the same material as the inner spacers 51 and the outer spacers 52. For example, the gap capping spacers 53 may include silicon nitride (SiN).

Figure 2C:
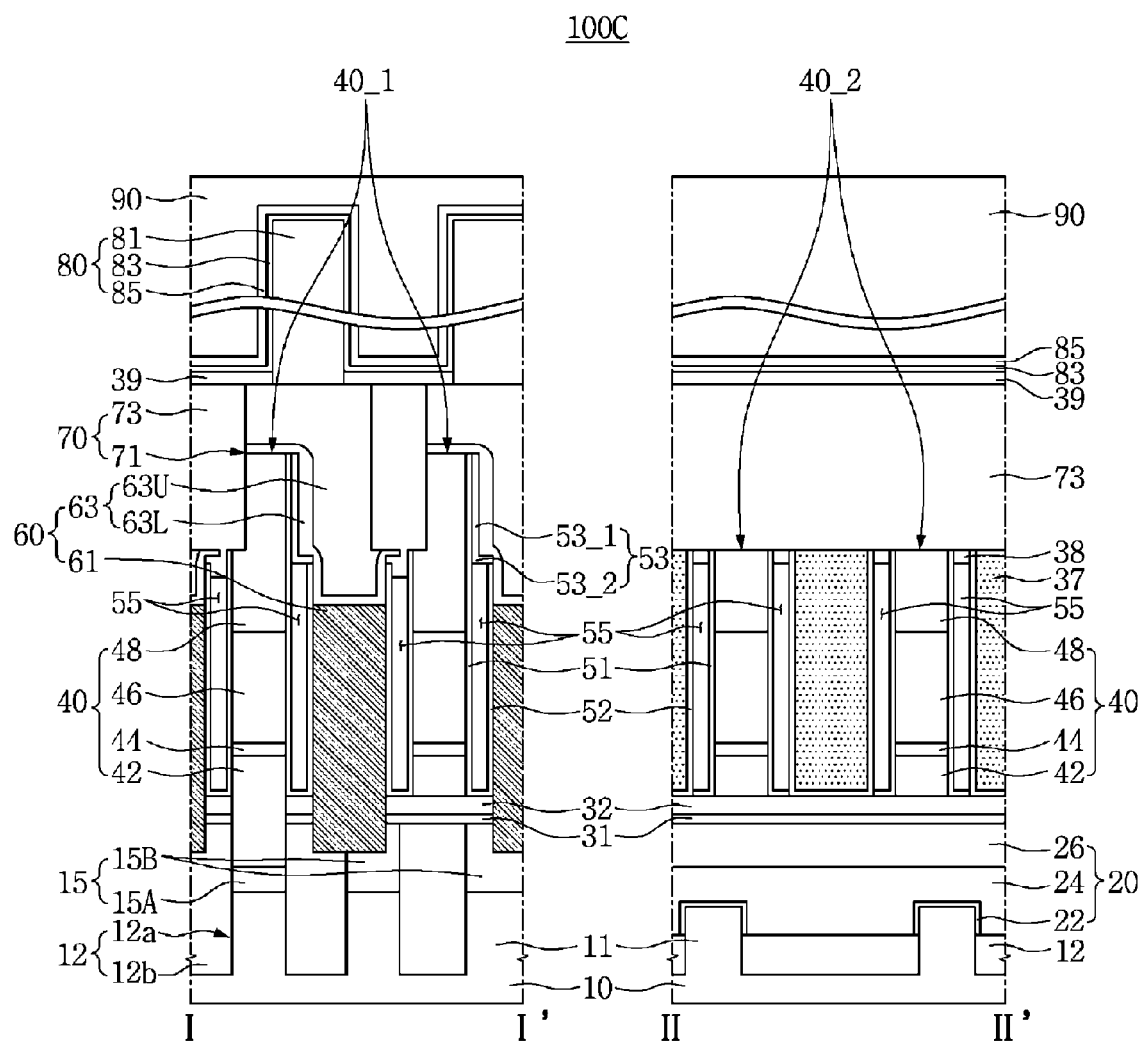

FIG. 2C illustrates longitudinal cross-sectional views taken along lines I-I' and II-II' of FIG. 1 for describing a semiconductor device in accordance with various example embodiments of the inventive concepts. In the example embodiments of the inventive concepts, detailed descriptions of the same content as those of the above-described example embodiments will be omitted.

Referring to FIG. 2C, a semiconductor device 100C according to the various example embodiments of the inventive concepts may include gap capping spacers 53 having first portions 53_1 disposed on sidewalls of bit line structures 40 and second portions 53_2 covering upper end portions of air spacers 55 and upper surfaces of outer spacers 52. Areas connecting the first portions 53_1 of the gap capping spacers 53 and the second portions 53_2 of the gap capping spacers 53 may have one or more step shapes. The first and second portions 53_1 and 53_2 with the step shape(s) may a same thickness, or alternatively, different thicknesses. For example, the second portion 53_2 may have a greater thickness than the first portion 53_1. The gap capping spacers 53 may include a different material from the inner spacers 51 and the outer spacers 52. For example, the gap capping spacers 53 may include aluminum oxide (AlO) or titanium oxide (TiO).

Further, the semiconductor device 100C according to the various example embodiments of the inventive concepts may further include gap capping patterns 38 disposed on the upper end portions of the air spacers 55 on the sidewalls of the second portions 40_2 of the bit line structures 40. The gap capping patterns 38 may include silicon nitride (SiN).

FIGS. 3A to 3L are vertical cross-sectional views taken along lines I-I' and II-II' of FIG. 1 for describing a method of manufacturing a semiconductor device in accordance with various example embodiments of the inventive concepts.

Figure 3A:
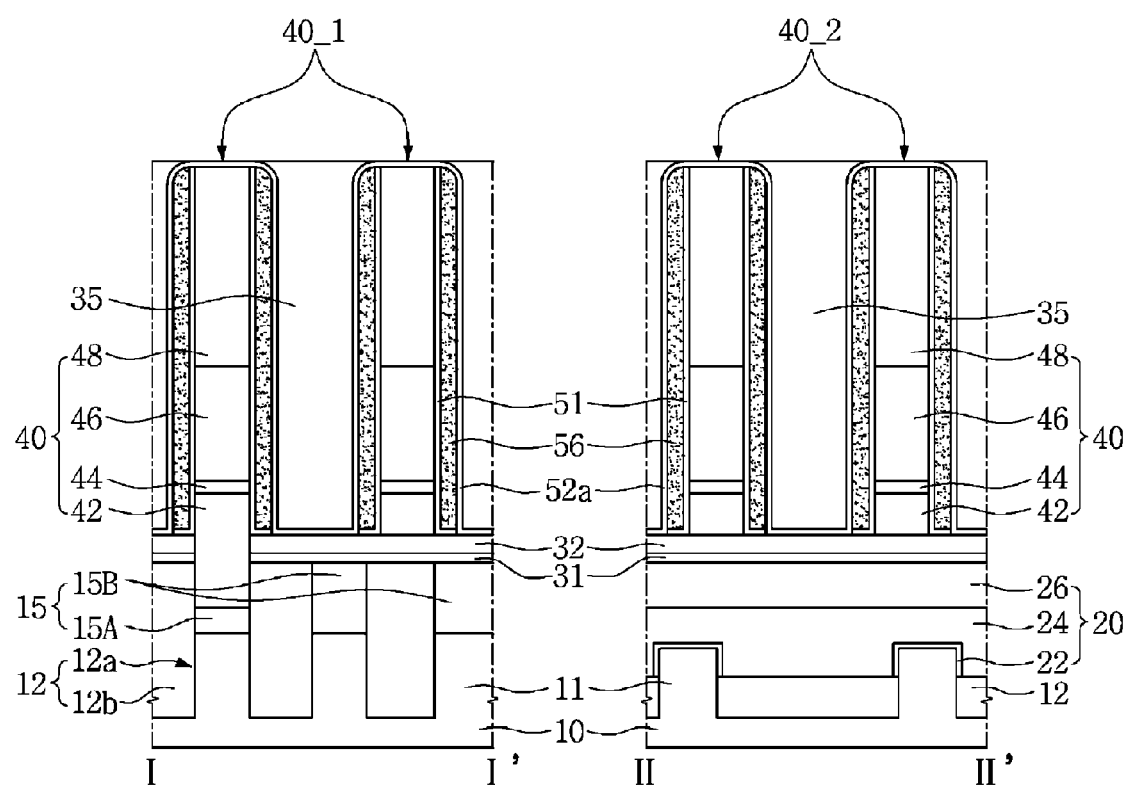

Referring to FIG. 3A, a method of manufacturing a semiconductor device 100A in accordance with various example embodiments of the inventive concepts may include preparing a substrate 10, forming device isolation regions 12 defining active regions 11 in the substrate 10, forming gate structures 20 and source/drain areas 15 in the substrate 10, forming a first lower interlayer insulating layer 31 and a second lower interlayer insulating layer 32 on the substrate 10, and forming bit line structures 40 on the substrate 10.

The substrate 10 may include a single crystalline semiconductor substrate such as a silicon wafer or SOI wafer.

The forming of the device isolation regions 12 may include performing a shallow trench isolation (STI) process. The STI process may include forming a device isolation trench 12a in the substrate 10 and filling the device isolation trench 12a with a device isolation insulator 12b. The device isolation insulator 12b may include silicon oxide ($SiO_2$).

The forming of the gate structures 20 may include forming gate trenches intersecting the active regions 11 and extending onto the device isolation region 12, forming gate insulating patterns 22 on surfaces of the active regions 11 exposed through the gate trenches, forming gate electrode patterns 24 on the gate insulating patterns 22 and the device isolation region 12 exposed through the gate trenches to partially fill the gate trenches, and forming gate capping patterns 26 on the gate electrode patterns 24 to fully fill the gate trenches.

The gate insulating patterns 22 may include at least one of silicon oxide, silicon nitride, silicon oxynitride, and a metal oxide. The metal oxide may include at least one of hafnium oxide ($Hf_xO_y$), aluminum oxide ($Al_xO_y$), zirconium oxide ($Zr_xO_y$), lanthanum oxide ($La_xO_y$), and titanium oxide ($Ti_xO_y$). The gate electrode patterns 24 may include at least one of titanium nitride (TiN), tantalum nitride (TaN), tungsten (W), and copper (Cu). The gate capping patterns 26 may include silicon nitride (SiN).

The forming of the source/drain areas 15 may include implanting impurity ions into the active regions 11 by performing an ion implantation process. The source/drain areas 15 may include first source/drain areas 15A and second source/drain areas 15B. For example, the first source/drain areas 15A may be in contact with the bit line structures 40, and the second source/drain areas 15B may be in contact with via structures 60 (see FIG. 2A) which will be described below. Upper surfaces of the source/drain areas 15 may be located at higher levels than upper surfaces of the gate electrode patterns 24.

The first lower interlayer insulating layer 31 may be entirely formed on the substrate 10 to cover the gate structures 20, the source/drain areas 15, and the device isolation regions 12 by performing a deposition process. The first lower interlayer insulating layer 31 may include silicon oxide ($SiO_2$).

The second lower interlayer insulating layer 32 may be entirely formed on the first lower interlayer insulating layer 31 by performing a deposition process. The second lower interlayer insulating layer 32 may include silicon nitride (SiN).

The forming of the bit line structures 40 may include forming recess regions exposing surfaces of the first source/drain areas 15A by partially removing upper portions of the second lower interlayer insulating layer 32, the first lower interlayer insulating layer 31, and the first source/drain areas 15A of the source/drain areas 15 by performing an etching process, forming an bit line contact layer on the second lower interlayer insulating layer 32 to fill the recess regions by performing a deposition process, sequentially forming an bit line barrier layer, a bit line electrode layer, and a bit line capping layer on the bit line contact layer by performing a deposition process, and forming bit line contact patterns 42, bit line barrier patterns 44, bit line electrode patterns 46, and bit line capping patterns 48 by patterning the bit line capping layer, the bit line electrode layer, the bit line barrier layer, and the bit line contact layer by performing an etching process.

A part of the bit line structures 40 may be in contact with the first source/drain areas 15A, and another part of the bit line structures 40 may be in contact with the second lower interlayer insulating layer 32 without contacting the first source/drain areas 15A. Further, the bit line structures 40 may include first portions 40_1 not vertically overlapping the gate structures 20, and second portions 40_2 vertically overlapping the gate structures 20. For example, referring to FIG. 1, the first portions 40_1 of the bit line structures 40 may be portions located between the gate structures 20, and the second portions 40_2 of the bit line structures 40 may be portions located on the gate structures 20.

The bit line contact patterns 42 may include polysilicon. The bit line barrier patterns 44 may include a metal or a metal compound such as titanium (Ti), titanium nitride (TiN), titanium silicide (TiSi), tantalum (Ta), tantalum nitride (TaN), tantalum silicide (TaSi), nickel silicide (NiSi), cobalt silicide (CoSi), tungsten nitride (WN), or tungsten silicide (WSi). The bit line electrode patterns 46 may include a metal such as tungsten (W) or copper (Cu). The bit line capping patterns 48 may include silicon nitride (SiN).

Referring to FIG. 3A again, the method may include forming inner spacers 51 and sacrificial spacers 56 on sidewalls of the bit line structures 40, forming an outer spacer material layer 52*a* covering upper surfaces of the bit line structures 40, outer side surfaces of the sacrificial spacers 56, and a surface of the second lower interlayer insulating layer 32, and forming a sacrificial layer 35 filling between the bit line structures 40.

The forming of the inner spacers 51 and the sacrificial spacers 56 may include sequentially and conformally forming an inner spacer material layer and a sacrificial spacer material layer on upper surfaces and sidewalls of the bit line structures 40 and the surface of the second lower interlayer insulating layer 32 by performing a deposition process, and removing the inner spacer material layer and the sacrificial spacer material layer formed on the upper surfaces of the bit line structures 40 and the surface of the second lower interlayer insulating layer 32 by performing an etching process. The inner spacer material layer may include silicon nitride (SiN). The sacrificial spacer material layer may include silicon oxide (SiO$_2$).

The outer spacer material layer 52*a* may be conformally formed on the upper surfaces of the bit line structures 40, the outer side surfaces of the sacrificial spacers 56, and the surface of the second lower interlayer insulating layer 32. The outer spacer material layer 52*a* may include silicon nitride (SiN).

The forming of the sacrificial layer 35 may include forming a sacrificial insulating layer on the outer spacer material layer 52*a* to fill between the bit line structures 40 by performing a deposition process, and removing the sacrificial insulating layer to be exposed the outer spacer material layer 52*a* on the upper surfaces of the bit line structures 40 by performing a planarization process. The sacrificial layer 35 may include silicon oxide (SiO$_2$).

Figure 3B:
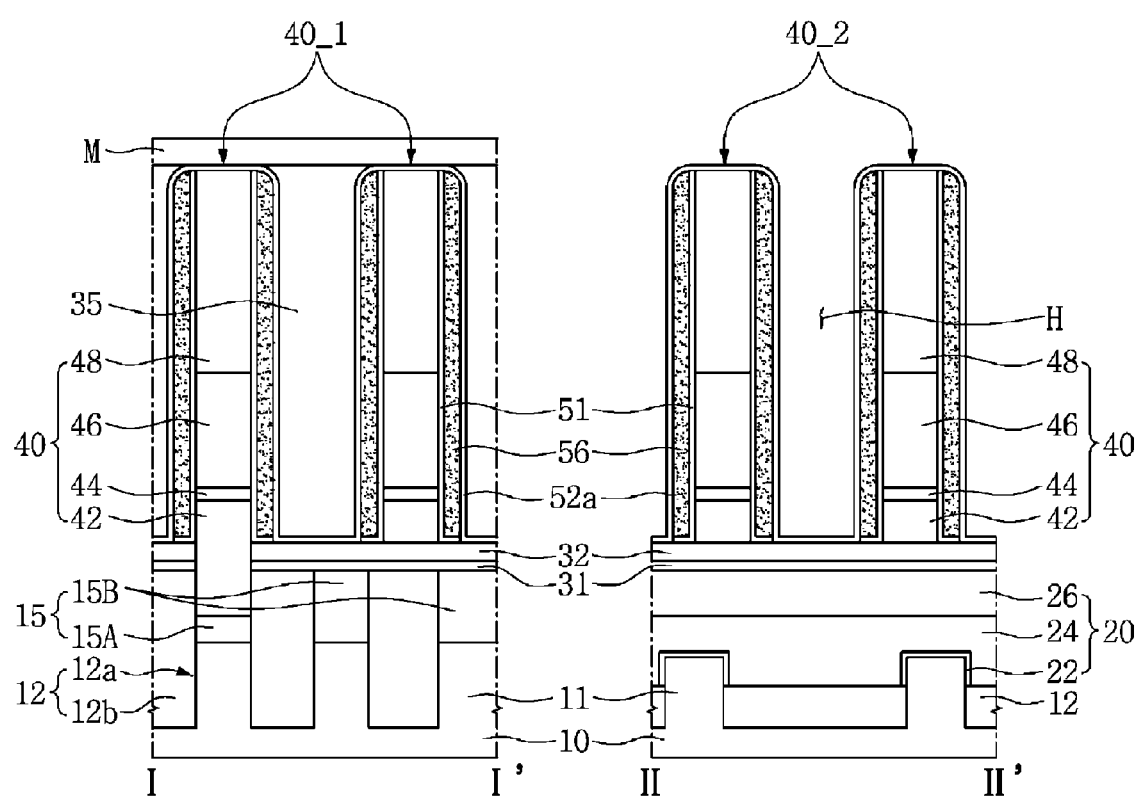

Referring to FIG. 3B, the method may include forming holes H between the bit line structures 40 by patterning the sacrificial layer 35. For example, the holes H may be formed between the second portions 40_2 of the bit line structures 40. In other words, the holes H may be formed between the bit line structures 40 vertically overlapping the gate structures 20.

The patterning of the sacrificial layer 35 may include forming a mask pattern M covering the sacrificial layer 35 between the first portions 40_1 of the bit line structures 40 and exposing the sacrificial layer 35 between the second portions 40_2 of the bit line structures 40 on the substrate 10 having the sacrificial layer 35, and removing the exposed sacrificial layer 35 by performing an etching process. The mask pattern M may include silicon oxide (SiO$_2$).

Figure 3C:
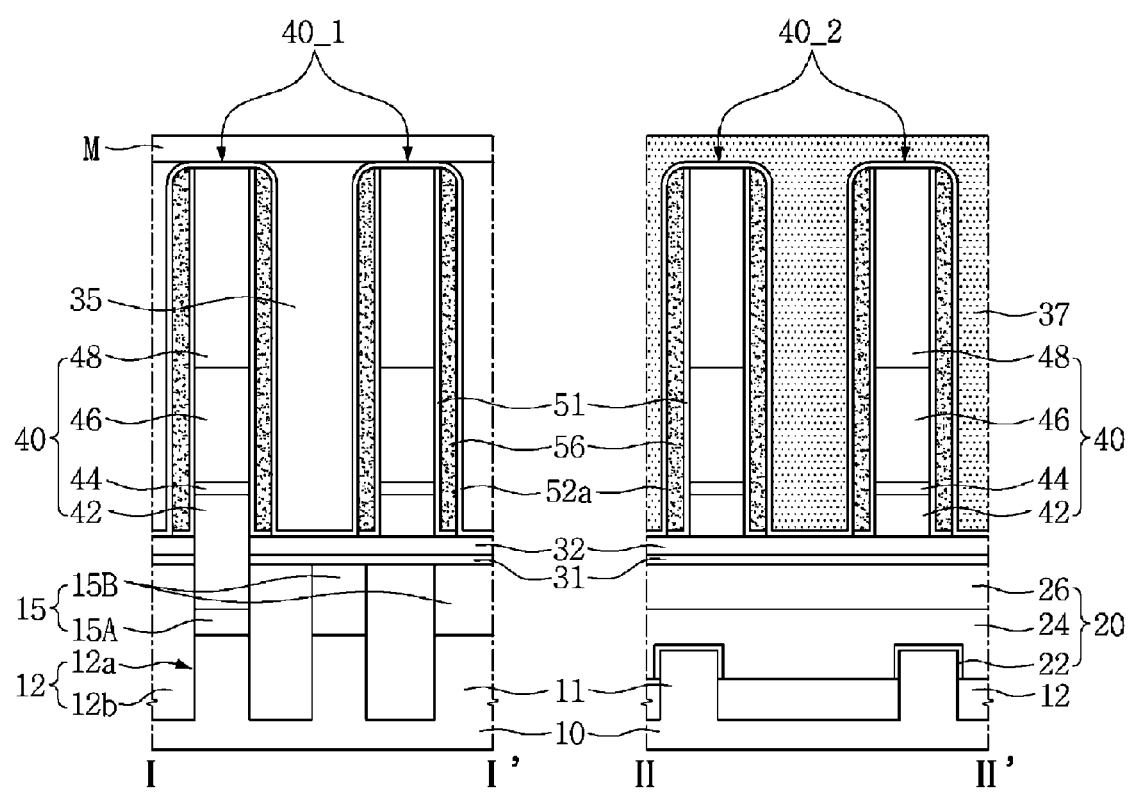

Referring to FIG. 3C, the method may include forming an intermediate interlayer insulating layer 37 filling the holes H and covering the bit line structures 40. For example, the intermediate interlayer insulating layer 37 may be formed to fill between the second portions 40_2 of the bit line structures 40, and cover the second portions 40_2 of the bit line structures 40. The forming of the intermediate interlayer insulating layer 37 may include forming an insulator layer filling the holes H on the substrate 10 by performing a deposition process, and removing the insulator layer by performing a planarization process until an upper surface of the mask pattern M is exposed. Accordingly, an upper surface of the intermediate interlayer insulating layer 37 may be substantially coplanar with the upper surface of the mask pattern M in the above process. Further, the upper surface of the intermediate interlayer insulating layer 37 may be located at a higher level than upper surfaces of the second portions 40_2 of the bit line structures 40. The intermediate interlayer insulating layer 37 may include silicon nitride (SiN).

Figure 3D:
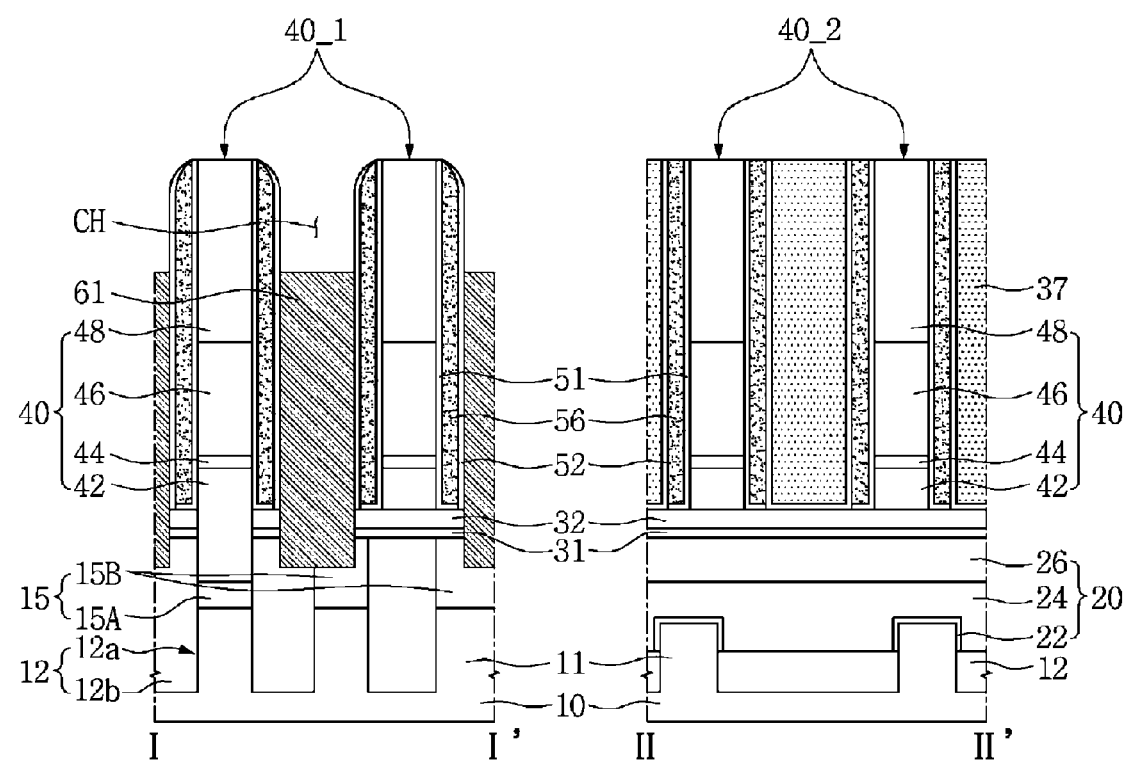

Referring to FIG. 3D, the method may include forming contact holes CH by removing the mask pattern M, the sacrificial layer 35 (see FIG. 3C) between the first portions 40_1 of the bit line structures 40, the outer spacer material layer 52*a*, the second lower interlayer insulating layer 32, and the first lower interlayer insulating layer 31 under the sacrificial layer 35 using the intermediate interlayer insulating layer 37 as an etching mask, and forming via plugs 61 partially filling the contact holes CH. In this process, outer spacers 52 disposed on the sacrificial spacers 56 on the sidewalls of bit line structures 40 may be formed. Outer side surfaces of the outer spacers 52, side surfaces of the first lower interlayer insulating layer 31 and side surfaces of the second lower interlayer insulating layer 32 may be exposed through the inner sidewalls of the contact holes CH. Further, bottom surfaces of the contact holes CH may be recessed toward an inside of the substrate 10. Accordingly, a part of the second source/drain areas 15B and a part of the device isolation regions 12 may be exposed through the bottom surfaces of the contact holes CH.

The forming of the via plugs 61 may include forming a via plug material layer filling the contact holes CH on the substrate 10 by performing a deposition process, and partially removing the via plug material layer by performing an etch-back process. The via plug material layer may include polysilicon.

Figure 3E:
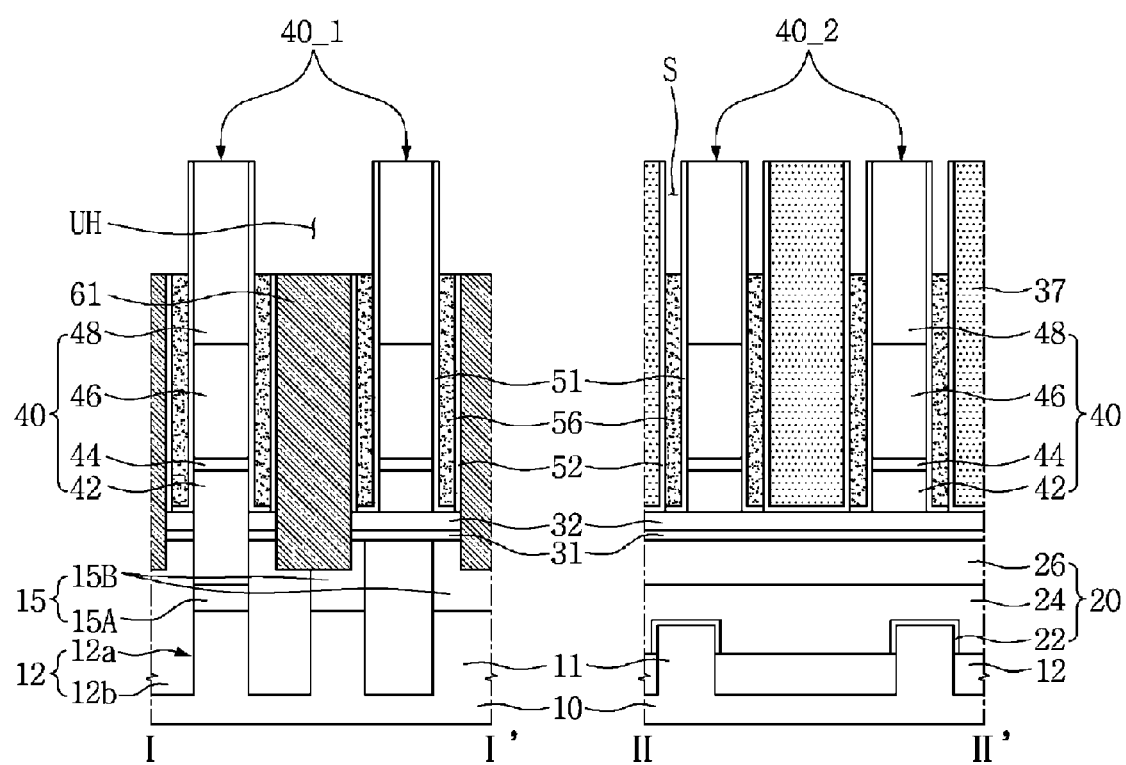

Referring to FIG. 3E, the method may include forming upper holes UH by removing the sacrificial spacers 56 and the outer spacers 52 located at higher levels than upper surfaces of the via plugs 61 by performing an etching process. Accordingly, distances between the bit line structures 40 located at higher levels than upper surfaces of the via plugs 61 may increase. In other words, horizontal widths of the upper holes UH may be greater than horizontal widths of the contact holes CH (see FIG. 3D). Further, upper surfaces of the sacrificial spacers 56 and the outer spacers 52 may be coplanar with the upper surfaces of the via plugs 61. The upper surfaces of the sacrificial spacers 56 and the outer spacers 52 may be exposed through bottom surfaces of the upper holes UH, and the outer side surfaces of the inner spacers 51 may be exposed through inner sidewalls of the upper holes UH. In this process, the sacrificial spacers 56 on sidewalls of the second portions 40_2 of the bit line structures 40 may be partially removed. Accordingly, spaces S may be formed on the sacrificial spacers 56 on sidewalls of the second portions 40_2 of the bit line structures 40.

Figure 3F:
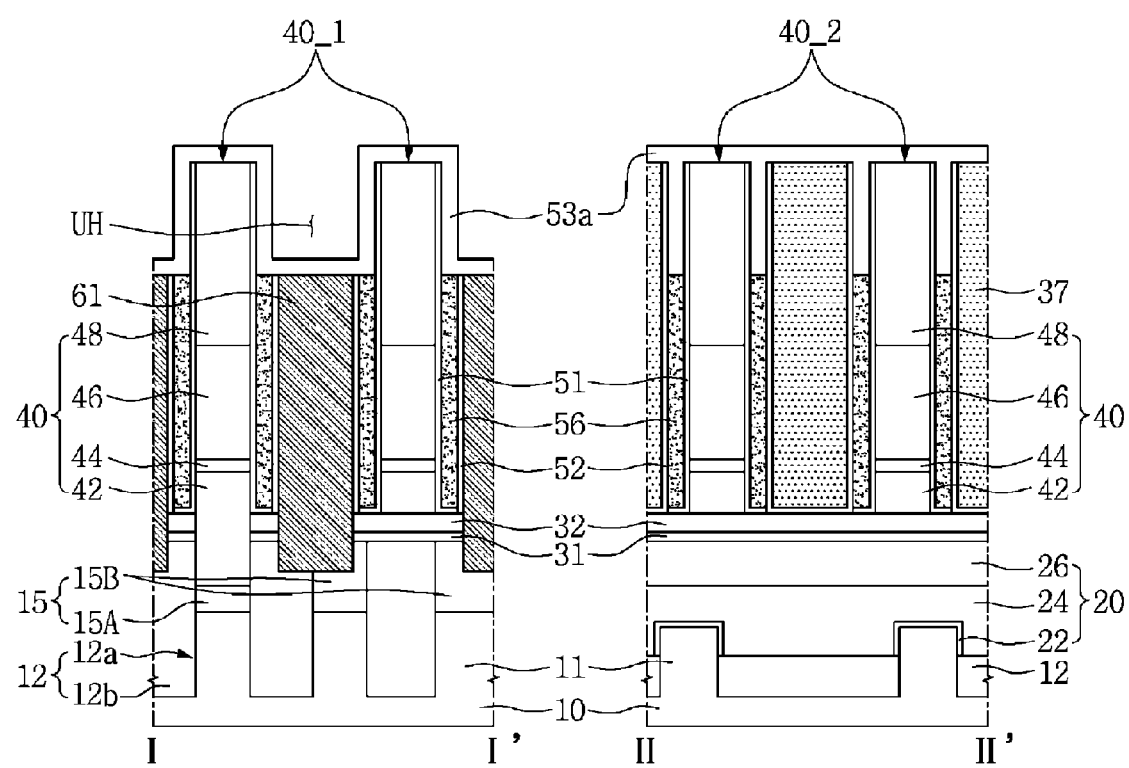

Referring to FIG. 3F, the method may include conformally forming a gap capping spacer material layer 53*a* on the upper surfaces of the via plugs 61, the upper surfaces of the outer spacers 52, the upper surfaces of the sacrificial spacers 56, the outer side surfaces and the upper surfaces of the inner spacers 51, the upper surfaces of the bit line structures 40, and a surface of the intermediate interlayer insulating layer 37 exposed through the bottom surfaces and inner sidewalls of the upper holes UH by performing a deposition process. The gap capping spacer material layer 53*a* may fill the spaces S on the sacrificial spacers 56 on sidewalls of the second portions 40_2 of the bit line structures 40.

The gap capping spacer material layer 53*a* may include a different material from the inner spacers 51, the sacrificial spacers 56, and the outer spacers 52. For example, the gap capping spacer material layer 53*a* may include SiBN.

Figure 3G:
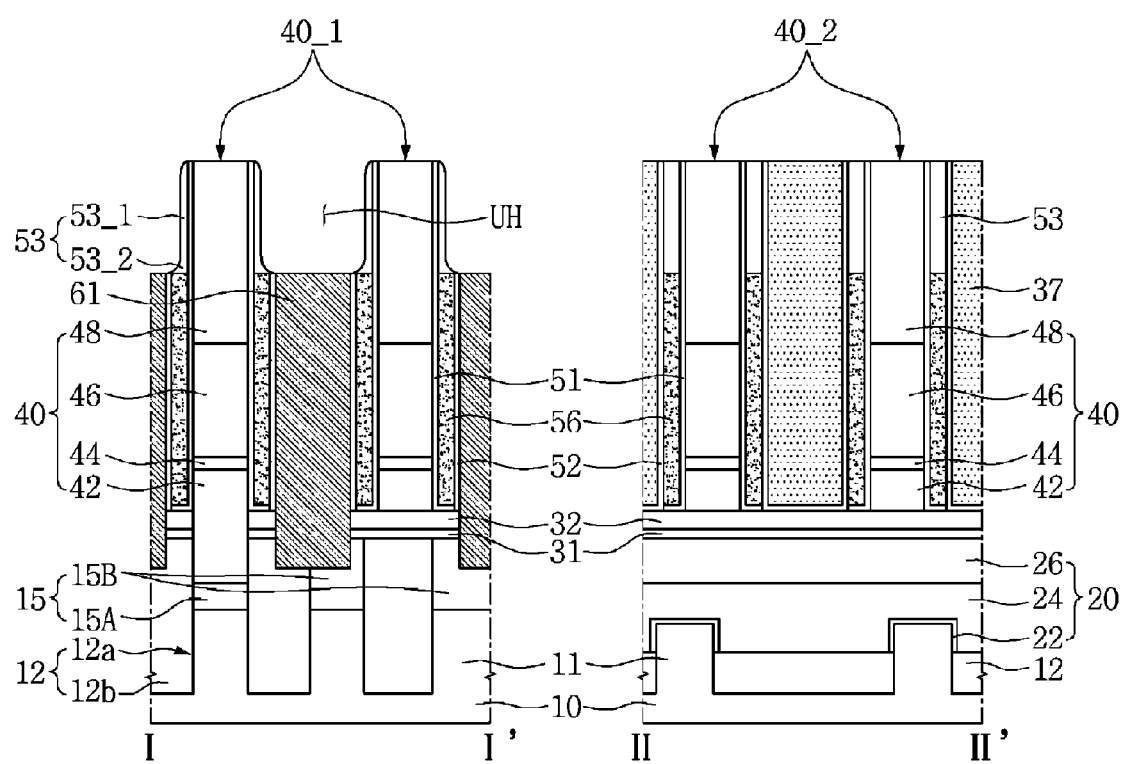

Referring to FIG. 3G, the method may include removing the gap capping spacer material layer 53*a* on the upper surfaces of the via plugs 61, the upper surfaces of the bit line structures 40, and the upper surfaces of the inner spaces 51 by performing an etching process. In this process, gap capping spacers 53 disposed on upper sidewalls of the first portions 40_1 of the bit line structures 40 and filling the spaces S on the sacrificial spacers 56 on sidewalls of the second portions 40_2 of the bit line structures 40 may be formed.

For example, the gap capping spacers 53 disposed on the upper sidewalls of the first portions 40_1 of the bit line structures 40 may include first portions 53_1 disposed on the inner spacers 51 on upper sidewalls of the bit line structures 40 and second portions 53_2 disposed on upper surfaces of the outer spacers 52 and the sacrificial spacers 56. Horizontal widths the first portions 53_1 of the gap capping spacers 53 may be smaller than horizontal widths the second portions 53_2 of the gap capping spacers 53. Areas connecting the first portions 53_1 of the gap capping spacers 53 and the second portions 53_2 of the gap capping spacers 53 may have round shapes.

Figure 3H:
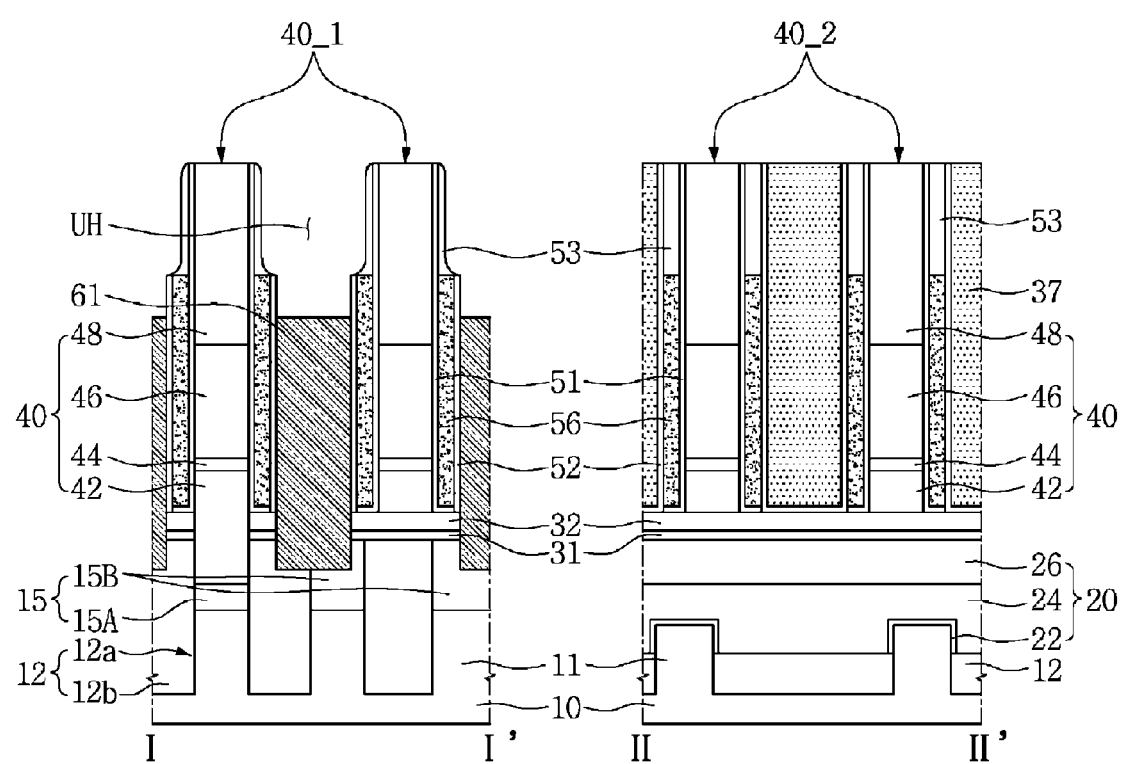

Referring to FIG. 3H, the method may include partially removing the via plugs 61 by performing an etching process. The upper surfaces of the via plugs 61 may be located at lower levels than the upper surfaces of the sacrificial spacers 56 and the outer spacers 52. Accordingly, upper outer side surfaces of the outer spacers 52 may be exposed.

Figure 3I:
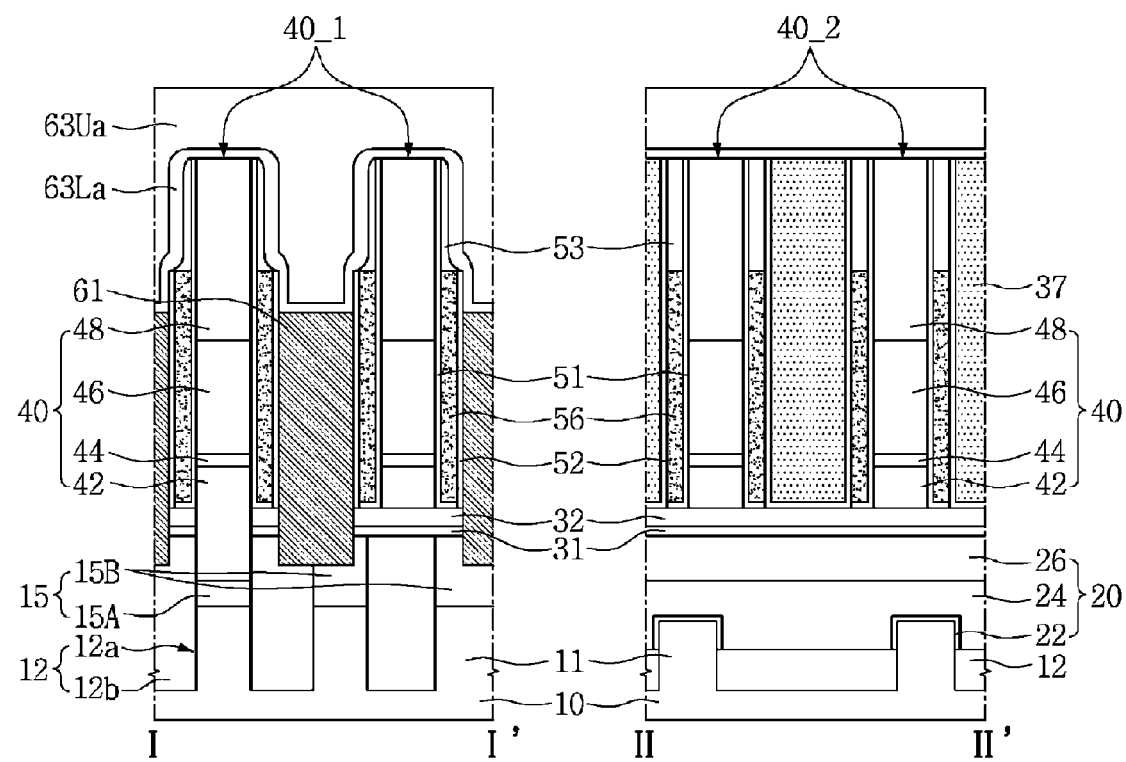

Referring to FIG. 3I, the method may include conformally forming a via barrier layer 63La on the upper surfaces of the via plugs 61, the upper outer side surfaces of the outer spacers 52, outer side surfaces and upper surfaces of the gap capping spacers 53, the upper surfaces of the bit line structures 40, the upper surfaces of the inner spacers 51, and an upper surface of the intermediate interlayer insulating layer 37 by performing a deposition process, and forming via electrode layer 63Ua filling the upper holes UH (see FIG. 3H) on the via barrier layer 63La. The via barrier layer 63La may include at least one of titanium nitride (TiN), tantalum nitride (TaN), and another metal nitride. The via electrode layer 63Ua may include a metal such as tungsten (W) or copper (Cu).

In example embodiments, the method may include forming silicide patterns on the via plugs 61 by performing a silicide process. The silicide patterns may include titanium silicide (TiSi), tungsten silicide (WSi), nickel silicide (NiSi), cobalt silicide (CoSi), or another metal silicide.

Figure 3J:
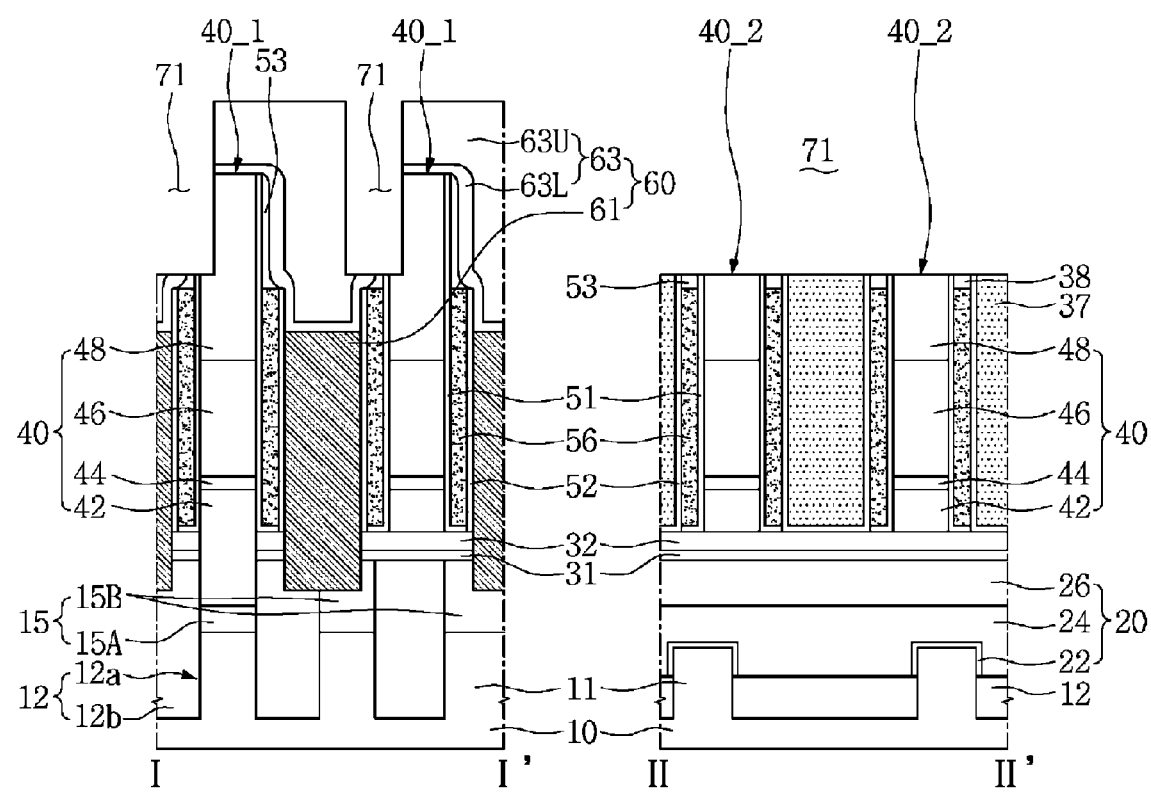

Referring to FIG. 3J, the method may include forming pad isolation trenches 71 by partially removing the via electrode layer 63Ua and the via barrier layer 63La by performing an etching process. In this process, via pads 63 including via barrier patterns 63L and via electrode patterns 63U may be formed. The bit line capping patterns 48 of the bit line structures 40, the inner spacers 51, the gap capping spacers 53, and the intermediate interlayer insulating layer 37 may be partially removed by the pad isolation trenches 71. The bit line capping pattern 48, the inner spacers 51, the gap capping spacers 53, and the via pads 63 may be exposed through bottom surfaces and inner sidewalls of the pad isolation trenches 71.

Figure 3K:
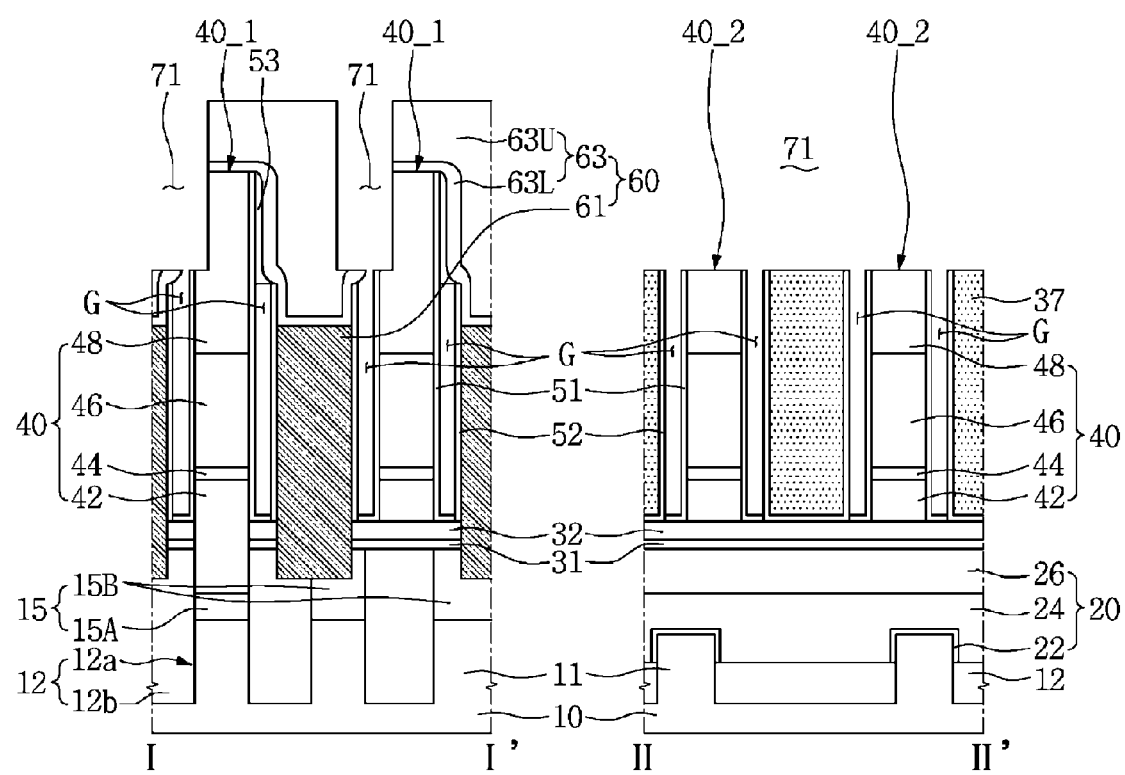

Referring to FIG. 3K, the method may include exposing the sacrificial spacers 56 by removing the gap capping spacers 53 exposed through the bottom surfaces of the pad isolation trenches 71 by performing an etching process, and removing the exposed sacrificial spacers 56 by performing an etching process. By removing the sacrificial spacers 56, gaps G may be formed between the inner spacers 51 and the outer spacers 52 on the sidewalls of the bit line structures 40. The gap capping spacers 53 exposed through the bottom surfaces of the pad isolation trenches 71 may provide a path from the bottom surfaces of the pad isolation trenches 71 to the sacrificial spacers 56. In this process, the gap capping spacers 53 disposed on the upper sidewalls of the bit line structures 40 covered by the via pads 63 may remain. The gap capping spacers 53 disposed on the upper sidewalls of the bit line structures 40 covered by the via pads 63 may define air spacers 55 (see FIG. 3L) on one sidewalls of the bit line structures 40.

Figure 3L:
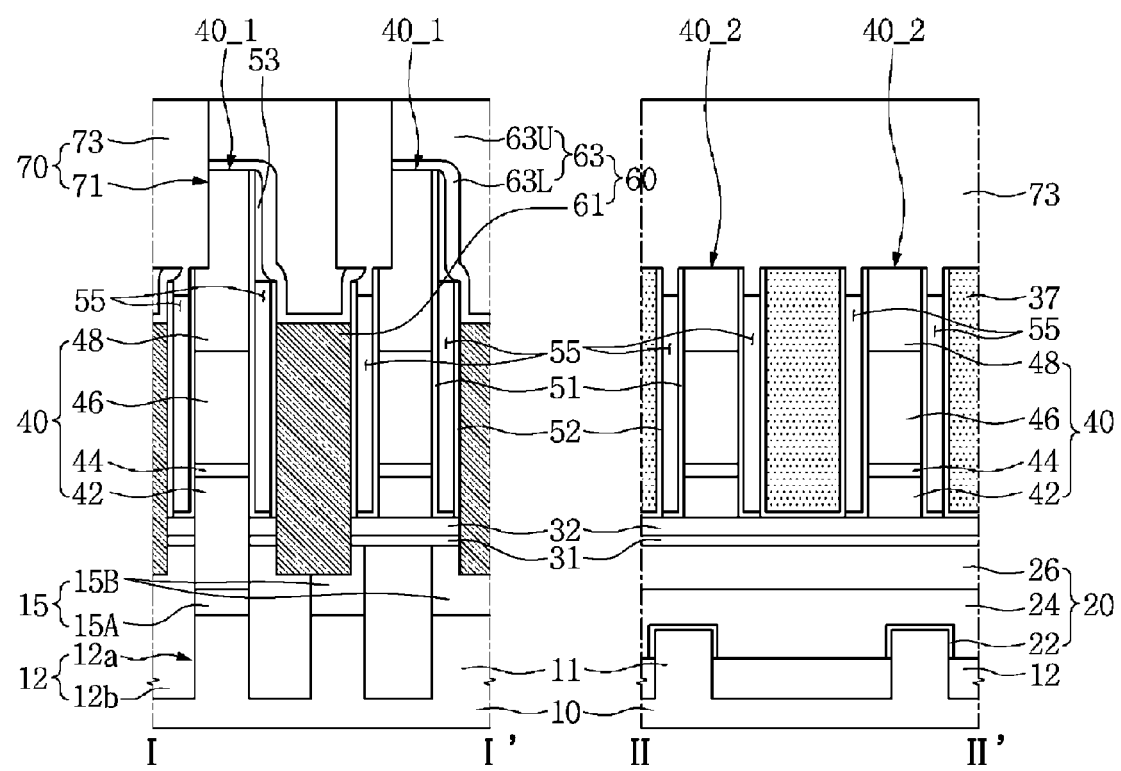

Referring to FIG. 3L, the method may include forming pad isolation regions 70 by filling the pad isolation trenches 71 with a pad isolation insulator 73. The pad isolation insulator 73 may include silicon nitride (SiN). The pad isolation insulator 73 may extend into the gaps G connected to the pad isolation trenches 71. In this process, air spacers 55 disposed between the inner spacers 51 and the outer spacers 52 may be formed.

The air spacers 55 vertically overlapping the pad isolation regions 70 may be defined by the inner spacers 51, the outer spacers 52, and the pad isolation insulator 73. Further, the air spacers 55 vertically overlapping the via pads 63 may be defined by the inner spacers 51, the outer spacers 52, and the gap capping spacers 53.

Upper end portions of the air spacers 55 vertically overlapping the pad isolation regions 70 may be located at lower levels than upper end portions of the air spacers 55 vertically overlapping the via pads 63.

Referring again to FIG. 2A, the method may include forming an etch stop layer 39 and capacitor structures 80 on the via pads 63 and the pad isolation regions 70, and a capacitor capping insulating layer 90 covering the capacitor structures 80. The forming of the etch stop layer 39 may include an etch stop material layer on the via pads 63 and the pad isolation regions 70 by performing a deposition process. For example, the etch stop material layer may include silicon nitride (SiN). Further, the forming of the capacitor structures 80 may include forming a mold insulating layer on the etch stop layer 39 by performing a deposition process, forming holes passing through the mold insulating layer and the etch stop layer 39, forming capacitor lower electrodes 81 filling the holes, removing the mold insulating layer, conformally forming a capacitor dielectric layer 83 on surfaces of the capacitor lower electrodes 81, and forming a capacitor upper electrode 85 on the capacitor dielectric layer 83. Further, the forming of the capacitor capping insulating layer 90 may include forming a capacitor capping insulator layer on the capacitor upper electrode 85 by performing a deposition process. The capacitor capping insulator layer may include silicon nitride (SiN).

Figure 4A:
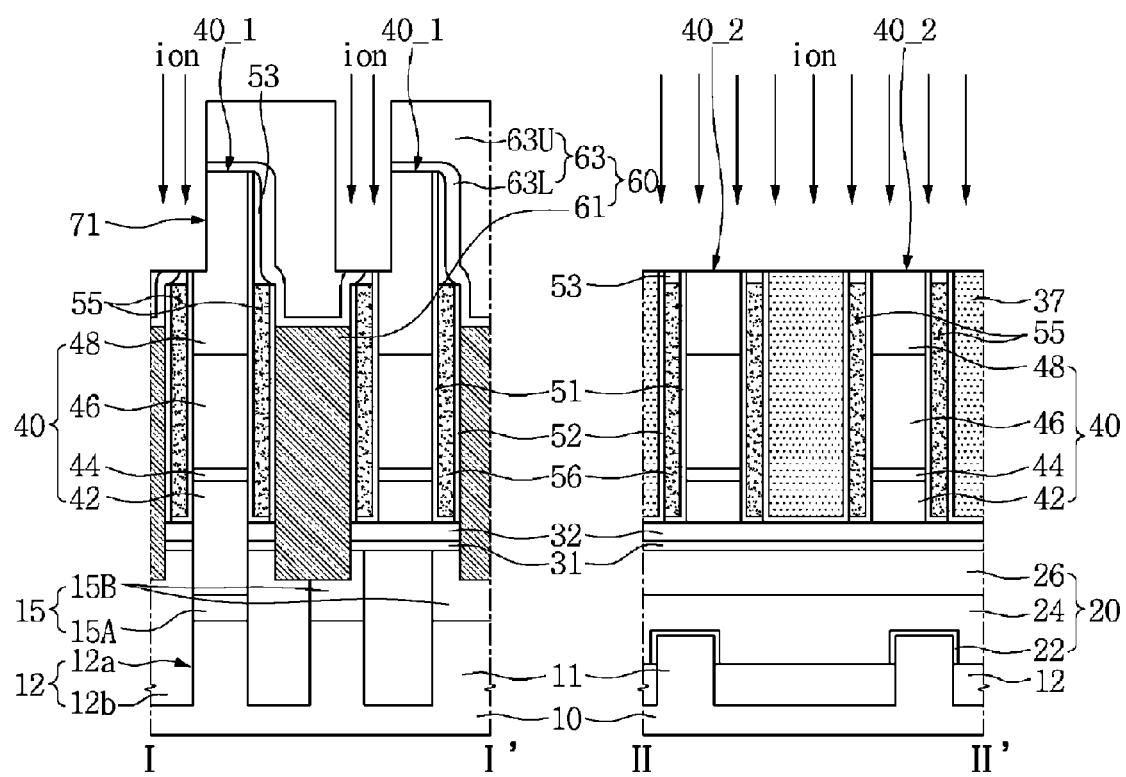
Figure 4B:
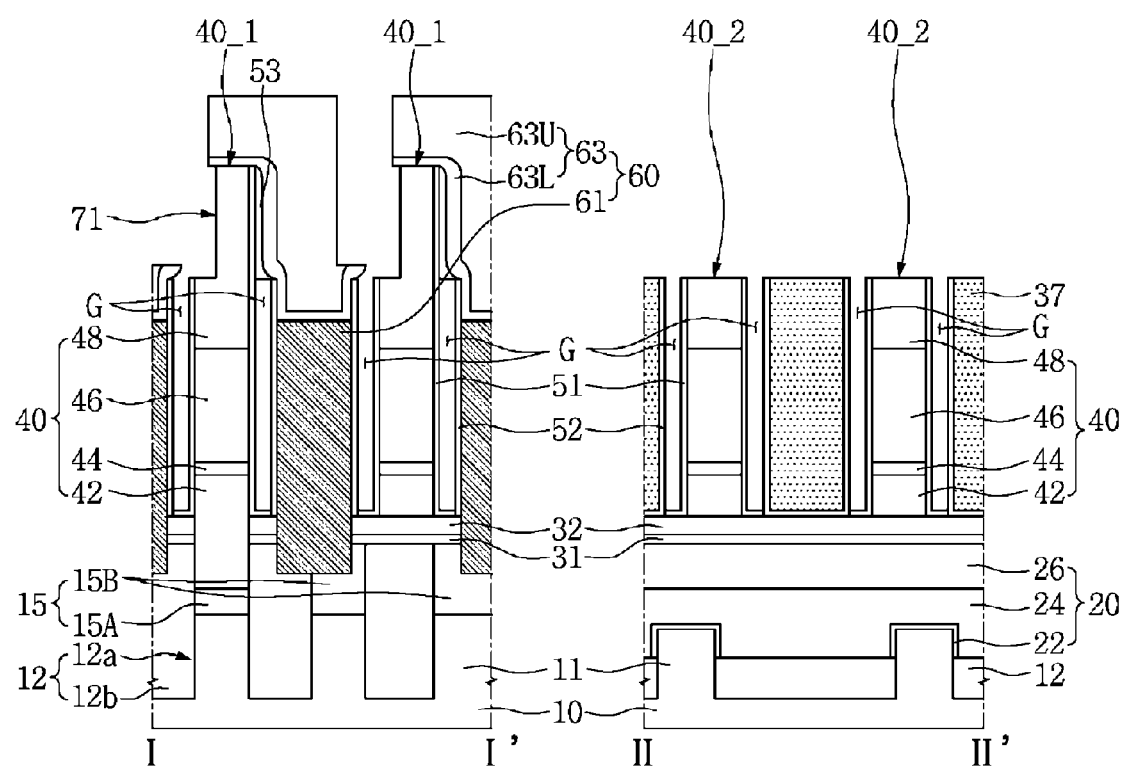
Figure 4C:
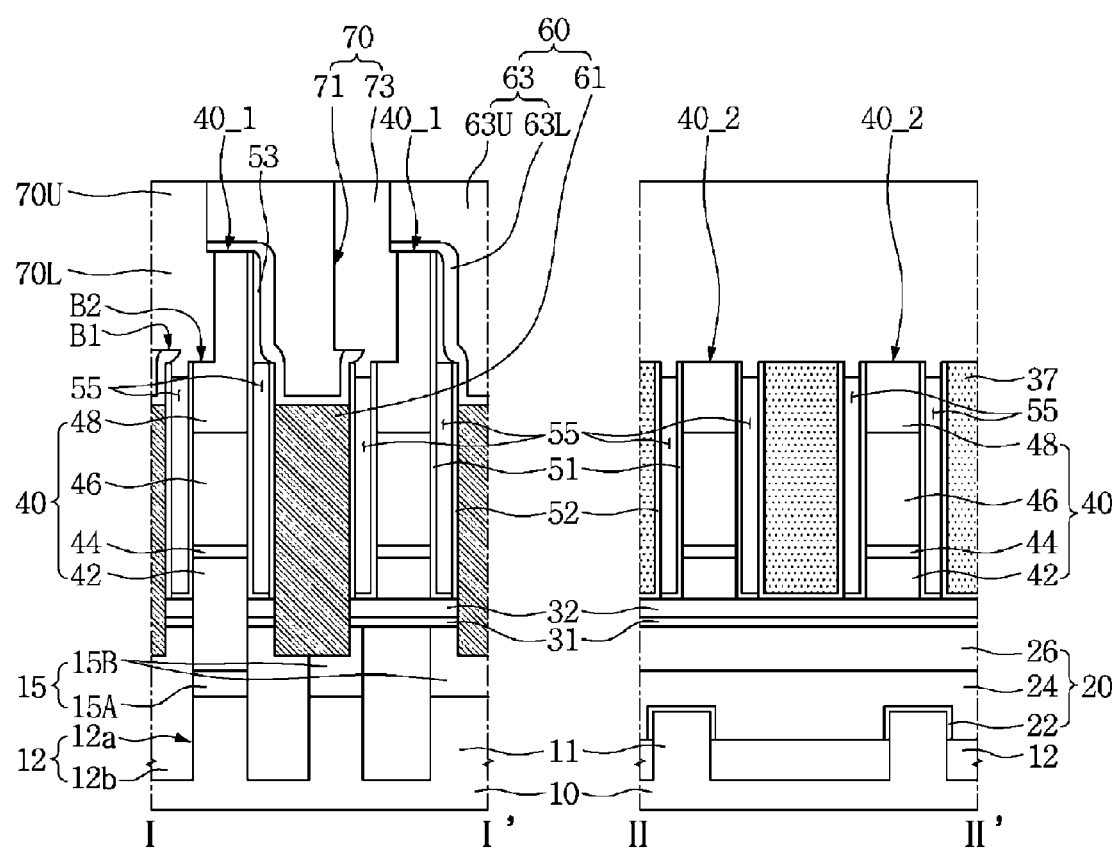

FIGS. 4A to 4C are vertical cross-sectional views taken along lines I-I' and II-II' of FIG. 1 for describing a method of manufacturing a semiconductor device in accordance with various example embodiments of the inventive concepts. In the example embodiments of the inventive concepts, detailed descriptions of the same content as those of the above-described example embodiments will be omitted.

Referring to FIG. 4A, the method may include implanting impurities ions into gap capping spacers 53 exposed through pad isolation trenches 71 by performing an ion implantation process, after forming the pad isolation trenches 71 by performing processes described with reference to FIGS. 3A to 3J. The gap capping spacers 53 may include silicon nitride (SiN). The impurities ions may include at least one of boron (B), carbon (C), phosphorus (P), germanium (Ge), arsenic (As), indium (In) and antimony (Sb). In this process, the impurities ions may be implanted in the bit line capping pattern 48 of the bit line structures 40, the inner spacers 51, the outer spacers 52, and the intermediate interlayer insulating layer 37 exposed through the pad isolation trenches 71.

Referring to FIG. 4B, the method may include removing the gap capping spacers 53 into which the impurities ions are implanted, by performing an etching process. In this process, portions, into which the impurities ions are implanted, may be removed from the bit line capping patterns 48 of the bit line structures 40, the inner spacers 51, the outer spacers 52, and the intermediate interlayer insulating layer 37. Accordingly, horizontal widths of the lower portions of the pad isolation trenches 71 may increase. Further, bottom surfaces of the pad isolation trenches 71 in contact with the bit line structures 40 may be located at lower levels than bottom surfaces of the pad isolation trenches 71 in contact with the via pads 63.

Referring to FIG. 4C, the method may include forming pad isolation regions 70 filling the pad isolation trenches 71 with a pad isolation insulator. The pad isolation regions 70 may include lower pad isolation regions 70L and upper pad isolation regions 70U. Horizontal widths of the lower pad isolation regions 70L may be greater than horizontal widths of the upper pad isolation regions 70U. The pad isolation regions 70 may include first bottom surfaces B1 in contact with the via pads 63 and second bottom surfaces B2 in contact with the bit line structures 40. The first bottom surfaces B1 of the lower pad isolation regions 70L may be located at higher levels than the second bottom surfaces B2 of the lower pad isolation regions 70L.

Referring again to FIG. 2B, the method may include forming an etch stop layer 39 and capacitor structures 80 on the via pads 63 and the pad isolation regions 70, and a capacitor capping insulating layer 90 covering the capacitor structures 80.

FIGS. 5A to 5F are vertical cross-sectional views taken along lines I-I' and II-II' of FIG. 1 for describing a method of manufacturing a semiconductor device in accordance with various example embodiments of the inventive concepts. In the example embodiments of the inventive concepts, detailed descriptions of the same content as those of the above-described embodiments will be omitted.

Figure 5A:
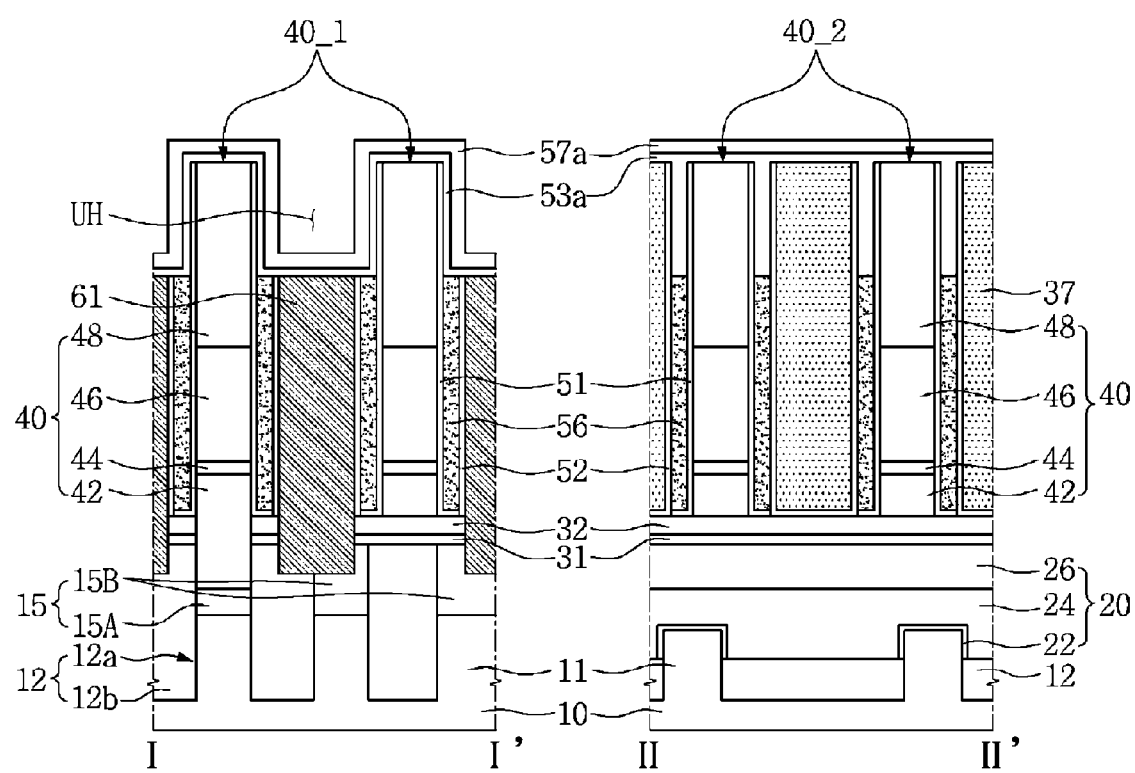

Referring to FIG. 5A, the method may include forming an insulating spacer material layer 57a on a gap capping spacer material layer 53a by performing a deposition process, after forming the gap capping spacer material layer 53a by performing processes described with reference to FIGS. 3A to 3F. The gap capping spacer material layer 53a may include aluminum oxide (AlO) or titanium oxide (TiO). The insulating spacer material layer 57a may include silicon oxide ($SiO_2$).

Figure 5B:
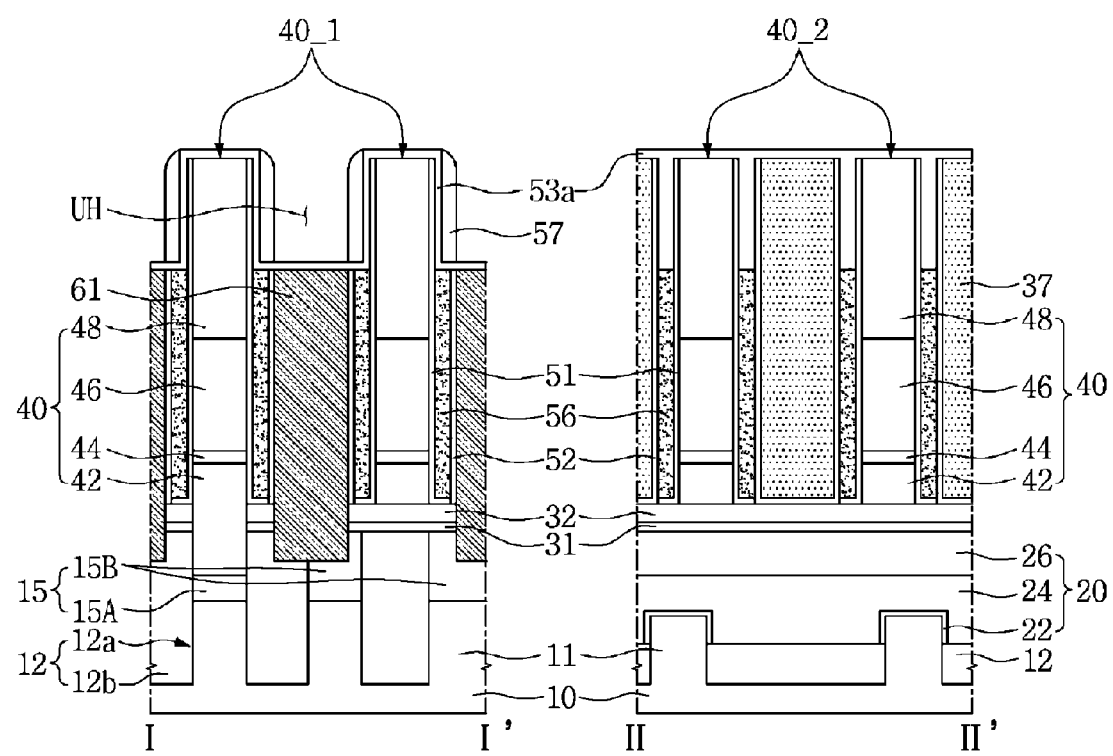

Referring to FIG. 5B, the method may include partially removing the insulating spacer material layer 57a by performing an etching process. In this process, insulating spacers 57 covering the gap capping spacer material layer 53a on upper sidewalls of the bit line structures 40 may be formed. Accordingly, the gap capping spacer material layer 53a located on upper surfaces of the via plugs 61 and the bit line structures 40 may be exposed.

Figure 5C:
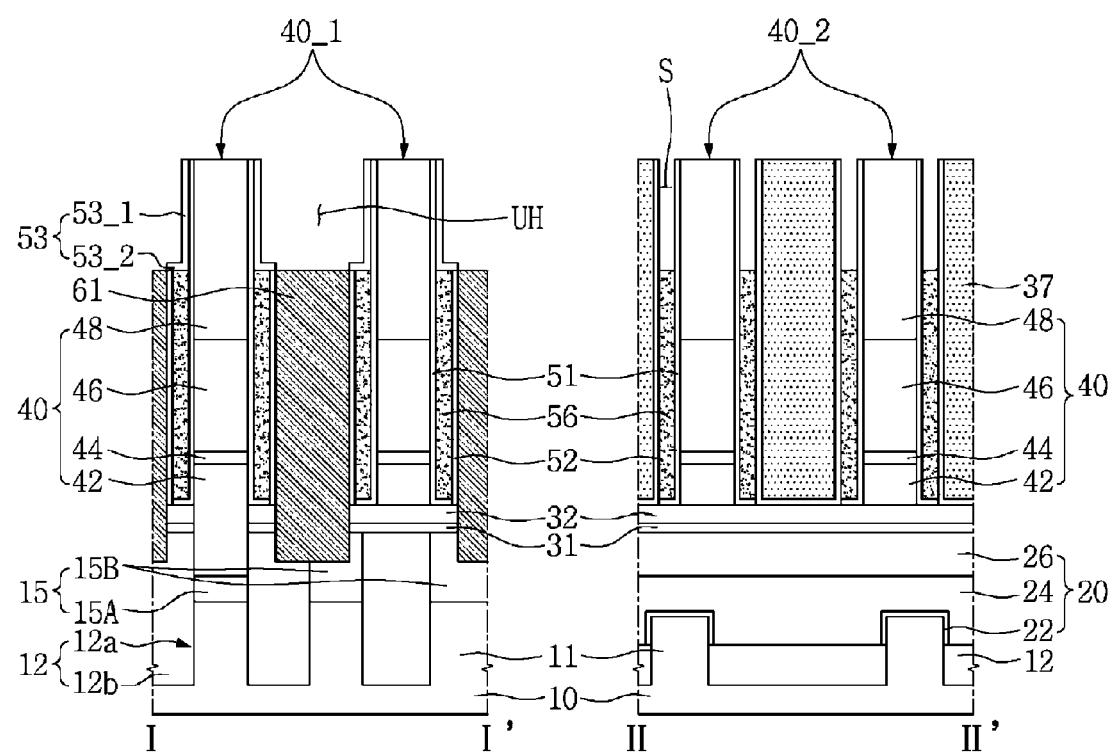

Referring to FIG. 5C, the method may include removing the gap capping spacer material layer 53a located on upper surfaces of the via plugs 61 and the bit line structures 40 by performing a wet etching process. In this process, gap capping spacers 53 disposed on the upper sidewalls of the bit line structures 40 and upper surfaces of the sacrificial spacers 56 and the outer spacers 52 may be formed. The gap capping spacers 53 may include first portions 53_1 disposed on the inner spacers 51 on the upper sidewalls of the bit line structures 40 and second portions 53_2 disposed on the upper surfaces of the sacrificial spacers 56 and the outer spacers 52. Areas connecting the first portions 53_1 and the second portions 53_2 of the gap capping spacers 53 may have step shapes. In this process, the gap capping spacer material layer 53a on sidewalls of the second portions 40_2 of the bit line structures 40 may be removed, and thus spaces S on upper sidewalls of the second portions 40_2 of the bit line structures 40 may be formed again.

Figure 5D:
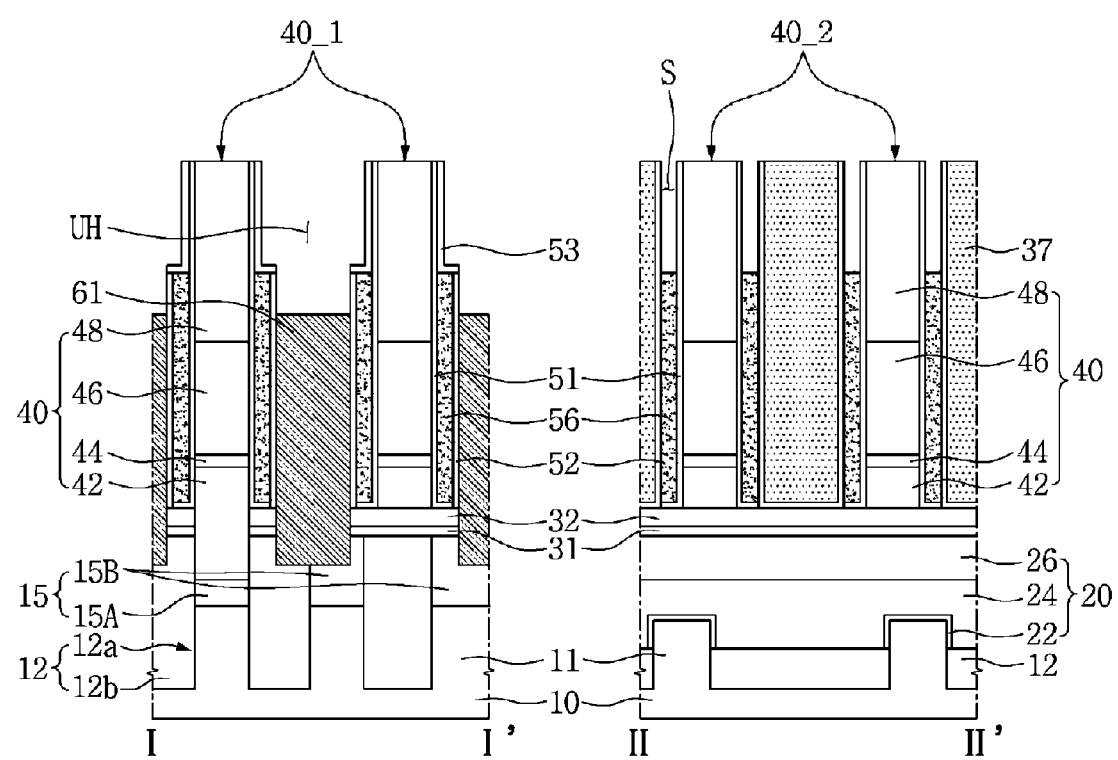

Referring to FIG. 5D, the method may include partially removing the via plugs 61 by performing an etching process.

Figure 5E:
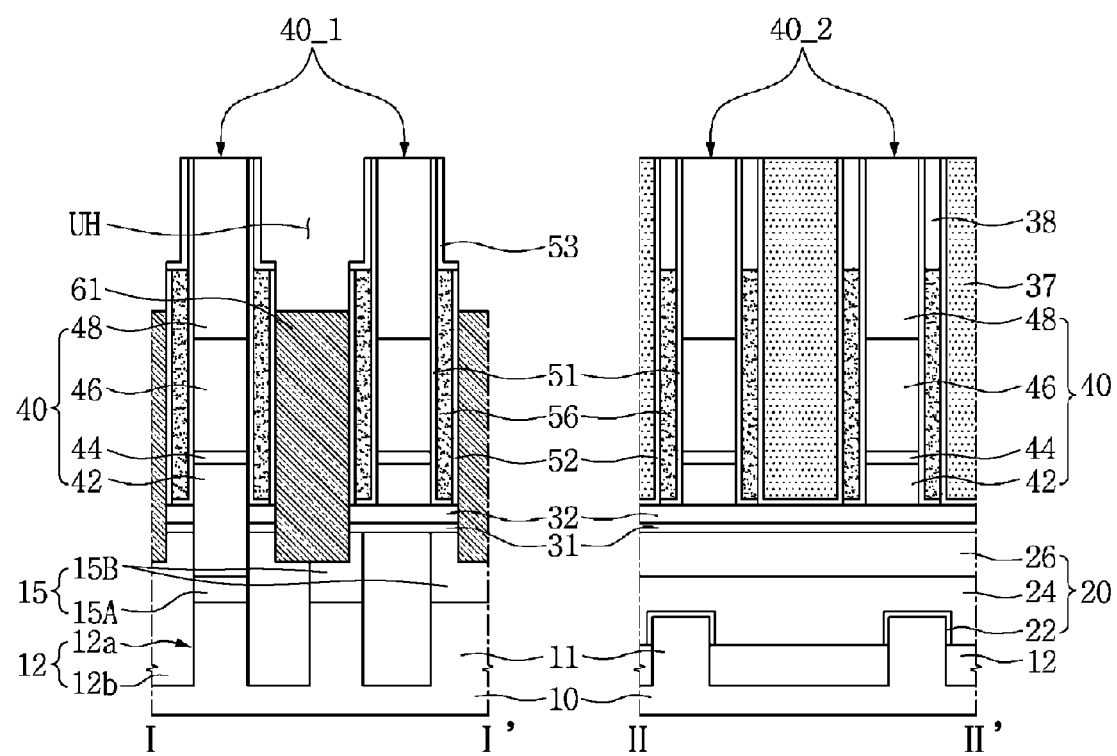

Referring to FIG. 5E, the method may include forming gap capping patterns 38 filling the spaces S on the upper sidewalls of the second portions 40_2 of the bit line structures 40. The gap capping patterns 38 may include silicon nitride (SiN).

Figure 5F:
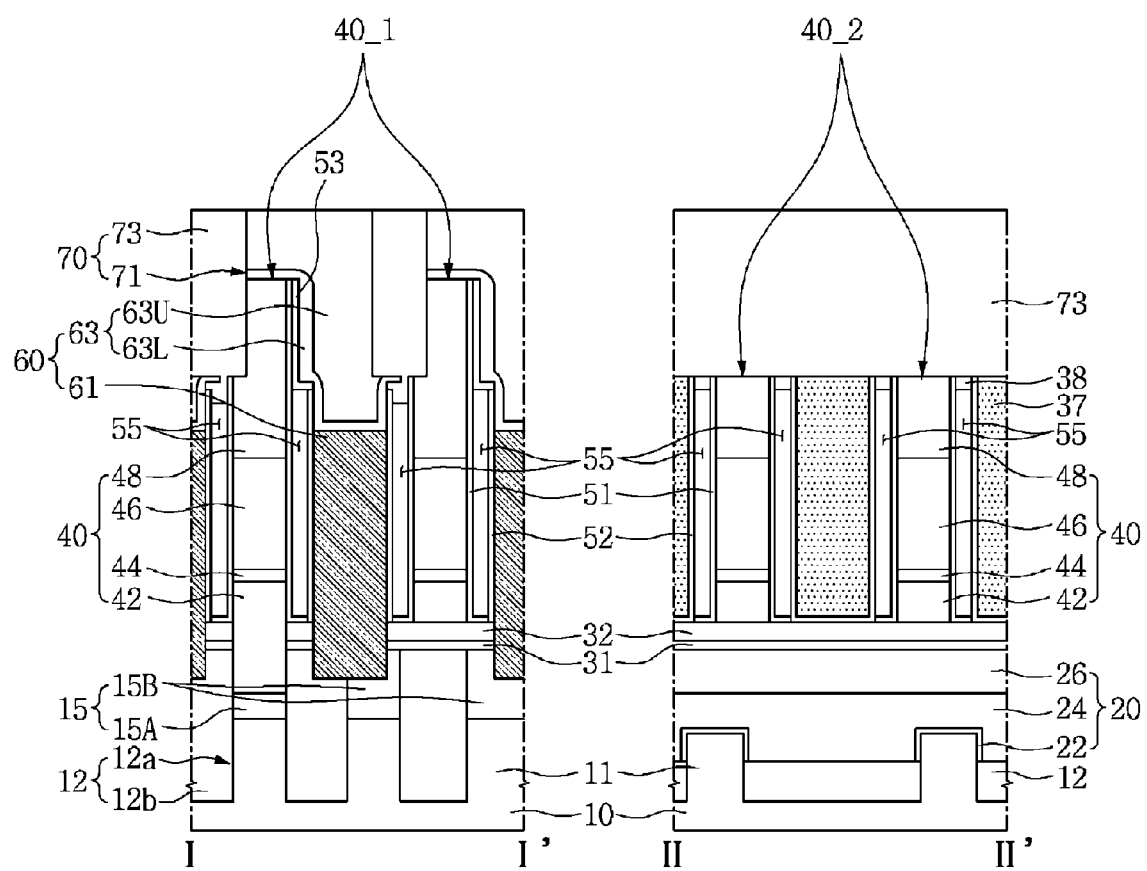

Referring to FIG. 5F, the method may include conformally forming a via barrier layer (see 63La in FIG. 3I) on the upper surfaces of the via plugs 61, upper outer side surfaces of the outer spacers 52, outer side surfaces of the gap capping spacers 53, upper surfaces of the bit line structures 40, upper surfaces of the inner spacers 51, and an upper surface of the intermediate interlayer insulating layer 37 by performing a deposition process. The method may further include forming a via electrode layer (see 63Ua in FIG. 3I) filling upper holes UH (see FIG. 5E) on the via barrier layer, forming pad isolation trenches 71 by partially removing the via electrode layer and the via barrier layer by performing an etching process, exposing the sacrificial spacers 56 by removing the gap capping spacers 53 exposed through bottom surfaces of the pad isolation trenches 71, removing the exposed sacrificial spacers 56 by performing an etching process, and forming pad isolation regions 70 filling the pad isolation trenches 71 with a pad isolation insulator 73. In this process, air spacers 55 disposed between the inner spacers 51 and the outer spacers 52 may be formed.

Referring again to FIG. 2C, the method may include forming an etch stop layer 39 and capacitor structures 80 on the via pads 63 and the pad isolation regions 70, and a capacitor capping insulating layer 90 covering the capacitor structures 80.

In the semiconductor device in accordance with various example embodiments of the inventive concepts, since a gap capping spacer in contact with a sacrificial spacer is additionally formed on an upper sidewall of a bit line structure, it is advantageous to secure a path through which an air spacer on a lower sidewall of the bit line structure can be formed.

Accordingly, a contact area of a via pad and a via plug is maximized and parasitic capacitance between bit line structures is simultaneously minimized. As a result, it can improve a performance of the semiconductor device.

Figure 6:
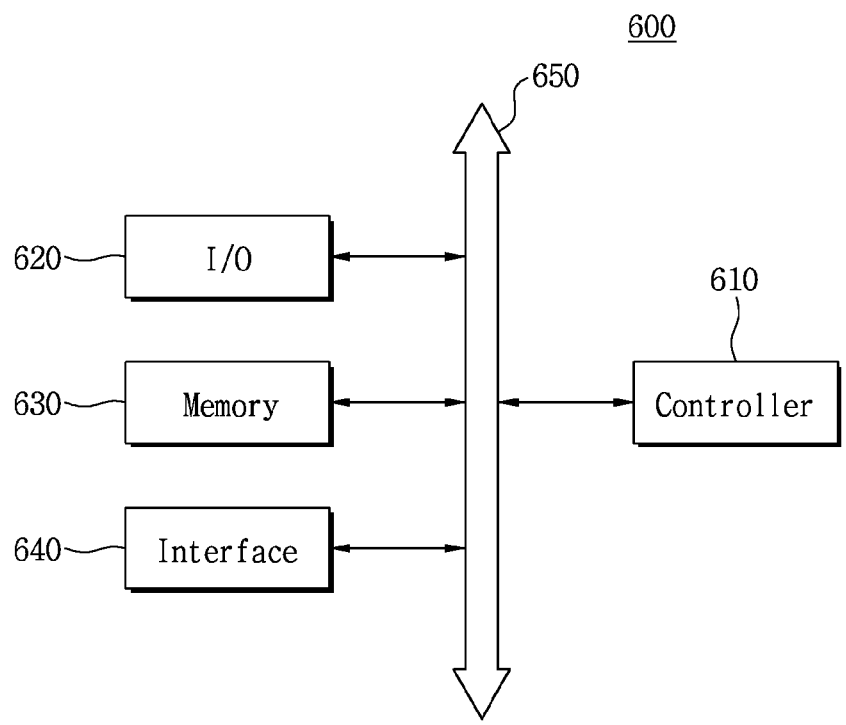
FIG. 6 is a block diagram of an electronic device including semiconductor devices according to various example embodiments.

FIG. 6 is a block diagram of an electronic device including semiconductor devices according to various example embodiments.

Referring to FIG. 6, an electronic device 600 may include a controller 610, an input/output (I/O) device 620, a memory 630, an interface 640, and a bus 650. The controller 610, the I/O device 620, the memory 630 and/or the interface 640 may be connected to each other through the bus 650. The bus 650 corresponds to paths through which data is transferred.

The controller 610 may include at least one of a microprocessor, a digital signal processor, a microcontroller, and logic elements that can perform similar functions. The I/O device 620 may include a keypad, a keyboard, and a display device. The memory 630 may store data and/or commands. The memory 630 may include semiconductor device according to various example embodiments. The memory 630 may include a volatile memory element such as a dynamic random access memory (DRAM) and/or a nonvolatile memory element such as a flash memory. The memory 630 may be configured as a DRAM, a PRAM, an MRAM, a resistive random access memory (ReRAM), a ferroelectric random access memory (FRAM), a NOR flash memory, a NAND flash memory, and a fusion flash memory (e.g., a combination of an SRAM buffer, a NAND flash memory and a NOR interface logic). The memory 630 may store commands (or user data) processed by the controller 610. The interface 640 may transfer data to a wireless communication network, or receive data from the wireless communication network. The interface 640 may be of a wired or wireless type. For example, the interface 640 may include an antenna and/or a wired or wireless transceiver.

The electronic device 600 may use a third-generation communication system protocol such as Code Division Multiple Access (CDMA), Global System for Mobile communication (GSM), North 20 American Digital Cellular (NADC), Enhanced-Time Division Multiple Access (E-TDMA), Wideband CDMA (WCDMA), or CDMA-2000.

The electronic device 600 may be used, for example, in wireless communication devices such as a personal digital assistants (PDAs), notebook computers, portable computers, web tablets, wireless phones, mobile phones, portable media players, navigation devices, a memory card, or any electronic device that can exchange (e.g., transmit and/or receive) information in a wireless environment. However, example embodiments are not limited to wireless communication devices, for example, the electronic device 600 may be a television, an automated teller machine (ATM), an elevator, or a ticket machine.

Figure 7:
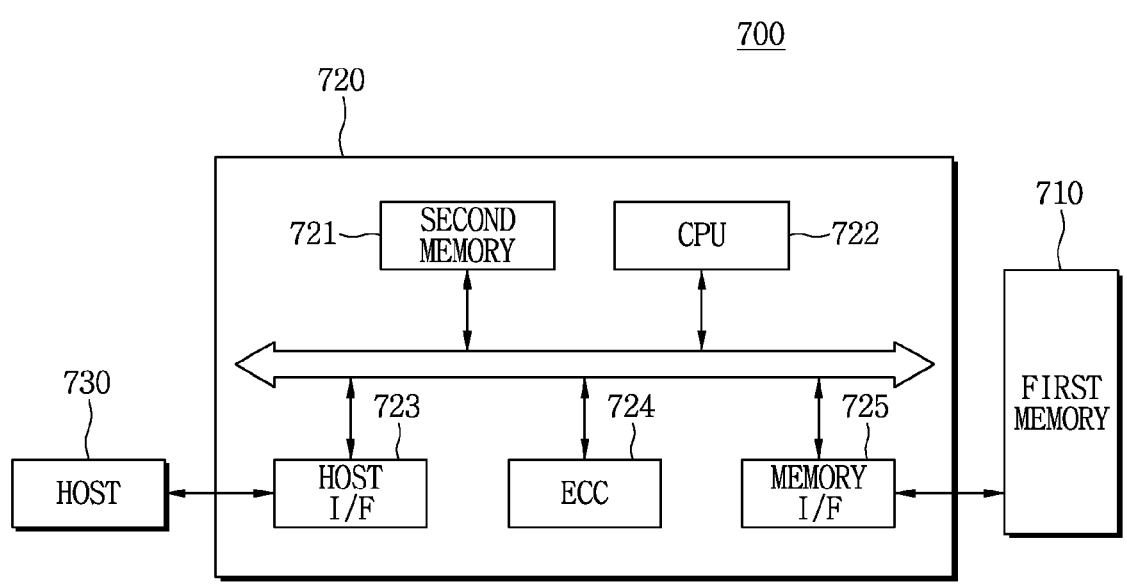
FIG. 7 is a block diagram illustrating a memory card including semiconductor devices according to various example embodiments.

FIG. 7 is a block diagram illustrating a memory card including semiconductor devices according to various example embodiments.

Referring to FIG. 7, a first memory 710 including a semiconductor device fabricated according to various example embodiments may be adopted in a memory card 700. The memory card 700 may include a memory controller 720 that controls date exchange between a host 730 and the first memory 710.

A second memory 721 may be used as a cache memory of a central processing unit 722. The second memory 721 may include a semiconductor device according to various example embodiments. A host interface 723 may include a protocol for the host 730 to access the memory card 700 to perform date exchange. An error correction code 724 may detect and correct errors of data read from the first memory 710. A memory interface 725 may interface with the first memory 710. The central processing unit 722 may perform overall control operation related to data exchange with the memory controller 720.

Other various effects have been described in the above detailed description.

The foregoing is illustrative of example embodiments and is not to be construed as limiting thereof. Although a few example embodiments have been described, those skilled in the art will readily appreciate that many modifications are possible in example embodiments without materially departing from the novel teachings. Accordingly, all such modifications are intended to be included within the scope of the disclosure as defined in the claims. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A semiconductor device, comprising:
    a first bit line structure and a second bit line structure on a substrate, the first and second bit line structures being spaced apart from each other;
    a via plug partially filling an area between the first bit line structure and the second bit line structure;
    a via pad in contact with an upper surface of the via plug and an upper surface of the first bit line structure, the via pad being spaced apart from an upper portion of the second bit line structure, the via plug and the first bit line structure separated from each other by a first cavity filled with air, the via plug and the second bit line structure being separated from each other by a second cavity filled with air;
    a gap capping spacer having a first portion on an upper sidewall of the first bit line structure and a second portion covering the first cavity, a horizontal width of the first portion of the gap capping spacer being smaller than a horizontal width of the second portion of the gap capping spacer; and
    a pad isolation region between an upper portion of the second bit line structure and the via pad, the pad isolation region vertically overlapping the second cavity.

2. The semiconductor device of claim 1, wherein
    a bottom surface of the pad isolation region defines an upper end portion of the second cavity,
    a bottom surface of the gap capping spacer defines an upper end portion of the first cavity, and
    the bottom surface of the gap capping spacer is at a higher level than the bottom surface of the pad isolation region.

3. The semiconductor device of claim 1, wherein the upper surface of the via plug is at a lower level than an upper end of the first cavity and an upper end of the second cavity.

4. The semiconductor device of claim 1, wherein an area connecting the first portion and the second portion of the gap capping spacer has a round shape or a step shape.

5. The semiconductor device of claim 1, further comprising:
    a first inner spacer between the first bit line structure and the first cavity;
    a second inner spacer between the second bit line structure and the second cavity;
    a first outer spacer between the via plug and the first cavity; and
    a second outer spacer between the via plug and the second cavity.

6. The semiconductor device of claim 5, wherein
    an upper surface of the first outer spacer is at a lower level than the upper surface of the first inner spacer, and
    an upper surface of the second outer spacer is at a lower level than the upper surface of the second inner spacer.

7. The semiconductor device of claim 5, wherein the gap capping spacer, the first and second inner spacers and the first and second outer spacers include a same material.

8. The semiconductor device of claim 5, wherein an upper surface of the first inner spacer is at a higher level than an upper surface of the second inner spacer.

9. The semiconductor device of claim 5, wherein
the first and second inner spacers and the first and second outer spacers include a same material, and
the gap capping spacer includes a different material from the first and second inner spacers and the first and second outer spacers.

10. The semiconductor device of claim 9, wherein
the first and second inner spacers and the first and second outer spacers include silicon nitride, and
the gap capping spacer includes at least one of silicon boronitride (SiBN), aluminum oxide (AlO) and titanium oxide (TiO).

11. A semiconductor device, comprising:
a first bit line structure and a second bit line structure on a substrate, the first and second bit line structures being spaced apart from each other;
a via structure between the first and second bit line structures, the via structure including a via plug and a via pad in contact with an upper surface of the via plug, a first side of the via structure and a lower sidewall of the first bit line structure being separated from each other by a first cavity filled with air, a second side of the via structure and a lower sidewall of the second bit line structure being separated from each other by a second cavity filled with air;
a first inner spacer between the first bit line structure and the first cavity;
a first outer spacer between the via plug and the first cavity;
a second inner spacer between the second bit line structure and the second cavity;
a second outer spacer between the via plug and the second cavity;
a pad isolation region partially extending between the second side of the via structure and an upper sidewall of the second bit line structure, a lower surface of the pad isolation region defining an upper end of the second cavity; and
a gap capping spacer between the first side of the via structure and an upper sidewall of the first bit line structure adjacent to the first side of the via structure, the gap capping spacer including a first portion extending along the upper sidewall of the first bit line structure in a first direction and a second portion extending on the first cavity in a second direction perpendicular to the first direction, a horizontal width of the first portion being smaller than a horizontal width of the second portion.

12. The semiconductor device of claim 11, wherein
the pad isolation region includes an upper pad isolation region at a higher level than upper surfaces of the first and second bit line structures and a lower pad isolation region between the via structure and the second bit line structure, and a horizontal width of the upper pad isolation region is smaller than a horizontal width of the lower pad isolation region.

13. The semiconductor device of claim 11, wherein
the lower surface of the pad isolation region includes a first lower surface in contact with the via structure, a second lower surface in contact with the second bit line structure, and a third lower surface defining an upper end of the second cavity, and
the first lower surface is at a higher level than the second lower surface.

14. The semiconductor device of claim 11, wherein
the pad isolation region includes a pad isolation trench partially extending between the upper sidewall of the second bit line structure and the second side of the via structure, and
a pad isolation insulator filling the pad isolation trench.

15. The semiconductor device of claim 11, wherein the gap capping spacer defines an upper end of the first cavity, and the upper end of the first cavity is higher than the upper end of the second cavity.

16. The semiconductor device of claim 11, wherein the pad isolation region includes a lower portion between the second inner spacer and the second outer spacer.

17. A semiconductor device, comprising:
a first bit line structure and a second bit line structure on a substrate;
a via structure between the first and second bit line structures;
a first spacer structure between the first bit line structure and the via structure, the first spacer structure including a first inner spacer extending along a sidewall of the first bit line structure, a first outer spacer on a first sidewall of the via structure, and a gap capping spacer including a first portion disposed along an upper sidewall of the first inner spacer and a second portion disposed on the first outer spacer;
a first cavity surrounded by the first inner spacer, the first outer spacer, and the gap capping spacer;
a second spacer structure between the second bit line structure and the via structure, the second spacer structure including a second inner spacer extending along a sidewall of the second bit line structure and a second outer spacer on a second sidewall of the via structure;
a pad isolation region between an upper portion of the via structure and an upper portion of the second bit line structure, the pad isolation region partially overlapping with the second bit line structure; and
a second cavity surrounded by the second inner spacer, the second outer spacer, and the pad isolation region.

* * * * *